(12) United States Patent
Then et al.

(10) Patent No.: US 11,380,679 B2
(45) Date of Patent: Jul. 5, 2022

(54) FET CAPACITOR CIRCUIT ARCHITECTURES FOR TUNABLE LOAD AND INPUT MATCHING

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US); Paul Fischer, Portland, OR (US); Walid Hafez, Portland, OR (US); Nicholas McKubre, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 16/141,641

(22) Filed: Sep. 25, 2018

(65) Prior Publication Data

US 2020/0098746 A1  Mar. 26, 2020

(51) Int. Cl.
| | | |
|---|---|---|
| H01L 27/06 | (2006.01) | |
| H03K 3/012 | (2006.01) | |
| H03J 3/20 | (2006.01) | |
| H01L 29/94 | (2006.01) | |
| H03H 11/28 | (2006.01) | |
| H03H 7/01 | (2006.01) | |

(Continued)

(52) U.S. Cl.
CPC .......... *H01L 27/0629* (2013.01); *H01L 29/94* (2013.01); *H03H 7/0153* (2013.01); *H03H 7/38* (2013.01); *H03H 11/04* (2013.01); *H03H 11/28* (2013.01); *H03J 3/20* (2013.01); *H03K 3/012* (2013.01)

(58) Field of Classification Search
None
See application file for complete search history.

(56) References Cited

U.S. PATENT DOCUMENTS

| | | | | |
|---|---|---|---|---|
| 6,407,412 B1 * | 6/2002 | Iniewski | ............. | H01L 27/0808 257/107 |
| 6,847,095 B2 * | 1/2005 | Benaissa | ................. | H01L 29/94 257/312 |

(Continued)

*Primary Examiner* — Thomas J. Hiltunen
(74) *Attorney, Agent, or Firm* — Essential Patents Group, LLP

(57) ABSTRACT

Integrated circuit architectures for load and input matching that include a capacitance selectable between a plurality of discrete levels, which are associated with a number of field effect transistors (FET) capacitor structures that are in an on-state. The capacitance comprises a metal-oxide-semiconductor (MOS) capacitance associated with each of the FET capacitor structures, and may be selectable through application of a bias voltage applied between a first circuit node and a second circuit node. Gate electrodes of the FET capacitor structures may be coupled in electrical parallel to the first circuit node, while source/drains of the FET capacitor structures are coupled in electrical parallel to the second circuit node. Where the FET capacitor structures have different gate-source threshold voltages, the number of FET capacitor structures in the on-state may be varied according to the bias voltage, and the capacitance correspondingly tuned to a desired value. The FET capacitor structures may be operable in depletion mode and/or enhancement mode.

17 Claims, 14 Drawing Sheets

(51) Int. Cl.
*H03H 7/38* (2006.01)
*H03H 11/04* (2006.01)

(56) References Cited

U.S. PATENT DOCUMENTS

| | | | | |
|---|---|---|---|---|
| 7,622,760 | B2 * | 11/2009 | Ogawa | H01L 29/0684 |
| | | | | 257/300 |
| 8,076,753 | B2 * | 12/2011 | Shimbayashi | H01L 27/0811 |
| | | | | 257/532 |
| 8,218,285 | B2 * | 7/2012 | Shimanouchi | H01G 5/18 |
| | | | | 361/278 |
| 8,664,705 | B2 * | 3/2014 | Chiu | H01L 29/94 |
| | | | | 257/296 |
| 10,134,727 | B2 * | 11/2018 | Then | H01L 29/7787 |
| 10,692,862 | B2 * | 6/2020 | Ahmad | H03K 5/00006 |
| 2006/0125012 | A1 * | 6/2006 | Fathimulla | G01K 7/34 |
| | | | | 257/351 |
| 2019/0006530 | A1 * | 1/2019 | Marino | H01L 29/94 |

* cited by examiner

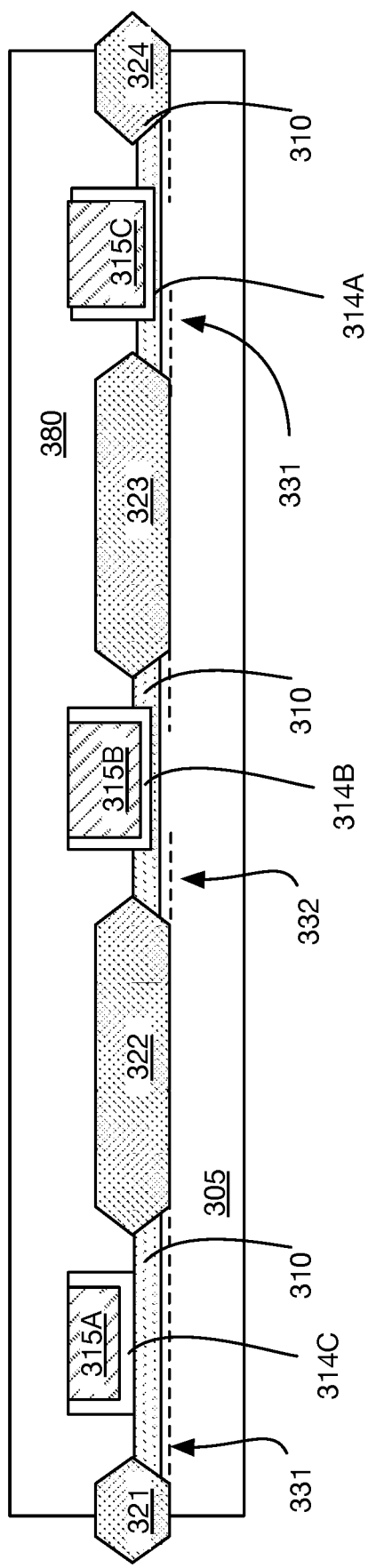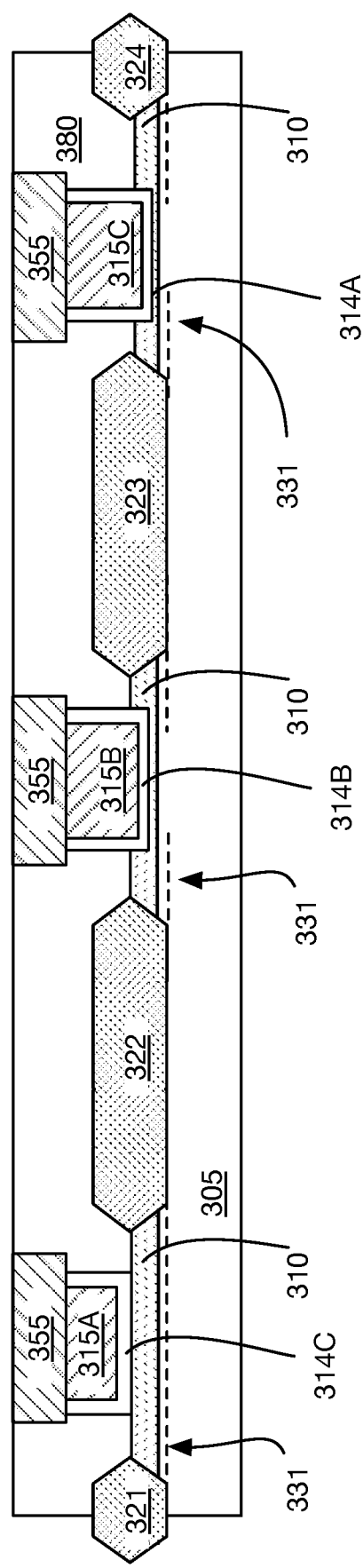
FIG. 5I
FIG. 5J

FET CAPACITOR CIRCUIT ARCHITECTURES FOR TUNABLE LOAD AND INPUT MATCHING

BACKGROUND

Demand for integrated circuits (ICs) in portable electronic applications has motivated higher levels of semiconductor device performance Mobile handset applications, for example, include wireless (radio frequency, or RF) transmitters and receivers (transceivers) that may operate in the gigahertz (GHz) frequency band. At such frequencies, load and input impedance matching of an antenna is challenging as the load impedance can change dramatically with the handset environment (e.g., between a hands-free call, and a handheld call where the handset may be more strongly affected by the proximity of a user). Multi-band and wideband standards are also increasing the complexity of the RF front end (RFFE) of mobile handsets, with antenna tuning becoming increasingly difficult.

Impedance matching typically entails an inductor-capacitor (LC) circuit. Since the handset antenna load may vary, a tunable, rather than a fixed, matching circuit is advantageous. FIG. 1A illustrates a schematic of a variable, or tunable capacitor 101, which may be employed in a tunable RF matching circuit. As shown, a first circuit node that is to receive an RF signal (RF1), for example from an RFFE, is capacitively coupled to a second circuit node that is to output the RF signal, for example through an antenna port. The first and second circuit nodes are coupled through a capacitance located between the RFFE and the antenna. The capacitance is variable, over a range of 5 to 10 pF, for example, as controlled by a tuning bias voltage.

In some conventional architectures, variable capacitor 101 is implemented with a ferroelectric capacitor (e.g. BaSrTiO). Such ferroelectric capacitors employ materials that are not readily integrated on-chip with other circuitry upstream (e.g., RFFE circuitry such as mixers, bandpass filters, amplifiers, etc.). Many such solutions are therefore limited to discrete implementations that prohibit further integration of the RFFE. Another issue with ferroelectric capacitors is that they can require exceedingly high tuning bias voltages (e.g., greater than 10V-20V) to span a desirable range of capacitance ($C_{min}$ to $C_{max}$). Such high voltages are difficult to accommodate, particularly in mobile handsets, and contribute to poor battery lifetimes. Another issue with ferroelectric capacitors is that they have analog C-V curves where small fluctuations in tuning bias voltage induce corresponding fluctuations in the capacitance. Drift or other noise in the tuning bias voltage, for example resulting from variation in handset temperature, can therefore induce a corresponding drift or noise in the RF power efficiency.

In some other architectures, transistors (e.g., field effect transistors, or FETs) are employed as switches to select between fixed capacitor banks having predetermined capacitance values. FIG. 1B, for example, illustrates a CMOS switched capacitor circuit 102 where separate capacitor banks 110 each comprise one or more metal-insulator-metal (MIM) capacitors 120 and have associated capacitances C1, C2, C3, etc. Capacitor banks 110 are switched in and out of an RF signal path between the RF1 and RF2 circuit nodes. Although virtually any capacitance range may be achieved with such architectures, each of the CMOS switches 105A, 105B, and 105C are typically implemented with a plurality of CMOS transistors and resistor elements that together require a large IC area. For example, a number of CMOS transistors may be stacked in series between the RF1 circuit node and capacitor bank for voltage division that can accommodate an appreciable maximum power level at a given drain-source breakdown voltage ($BV_{DS}$). In addition, large gate resistors and drain-source resistors (e.g., on the order of 100K ohm) are needed across each FET in switches 105A-105C to ensure adequate voltage balance across the FET stack. With current metal gate technology, most resistors implemented on an IC have a relative low sheet rho values (e.g., 200 ohm/square), and so the footprint of such resistors can be very large. Bandwidth of the FETs is another issue, with many silicon CMOS FET processes being limited to sub-GHz RF frequencies (e.g. 980 MHZ, or less).

Tunable capacitor circuit architectures and techniques that overcome these limitations are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 5A, 5B, 5C, 5D, 5E, 5F, 5G, 5H, 5I, 5J, 5K, and 5L are cross-sectional views of III-N FET capacitor structures as selected operations of the methods illustrated in FIG. 4 are performed, in accordance with some embodiments;

DETAILED DESCRIPTION

Figure 1A:
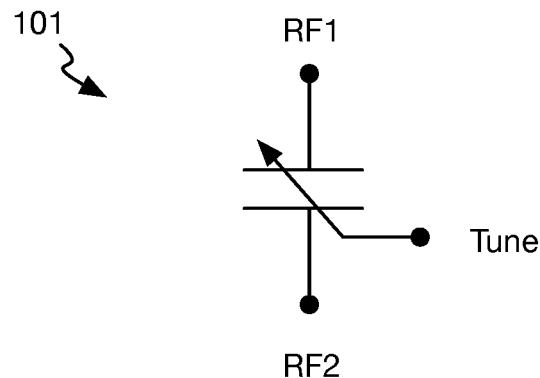
FIG. 1A illustrates a tunable capacitor suitable for load and input matching of a RF circuit.
Figure 1B:
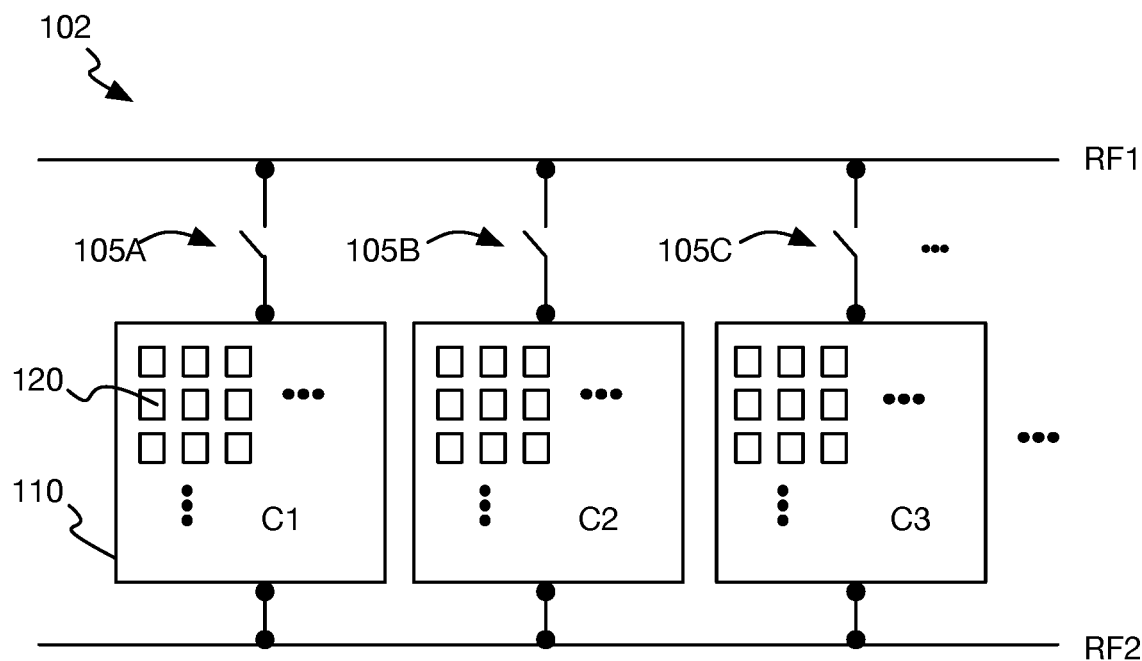
FIG. 1B illustrates a conventional integrated circuit (IC) having a tunable capacitance.

Tunable capacitance circuit architectures suitable for wideband and/or high frequency RF matching are described herein. Exemplary methods of fabricating an IC including III-N FET capacitor structures suitable for implementing a tunable capacitance architecture are also described. In the following text, numerous specific details are set forth, such as illustrative device architectures, to provide a thorough understanding of embodiments of the present disclosure. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Certain terminology may also be used in the following description for the purpose of reference only, and thus are not intended to be limiting. For example, terms such as "top," "bottom," "upper", "lower", "over," "above", "under," and "below" refer to directions in the drawings to which reference is made. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import. The terms "over," "under," "between," and "on" may also be used herein to refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Integrated circuit architectures including a capacitance selectable between a plurality of discrete levels are described herein. Such IC architectures may be employed in many applications with one example being circuitry for RF load and input matching. As described further below, the discrete capacitance levels are associated with an integer number of field effect transistor (FET) capacitor structures that enter an on-state as a function of a tuning bias voltage. The tunable capacitance comprises a metal-oxide-semiconductor (MOS) capacitance associated with each of the FET capacitor structures, which reaches a predictable value upon a corresponding FET entering the on-state. The number of FET capacitor structures in the on-state may be selected through application of a tuning bias voltage applied between a first circuit node and a second circuit node. Gate electrodes of the FET capacitor structures may be coupled in electrical parallel to the first circuit node, while source/drains of the FET capacitor structures may be tied together and coupled in electrical parallel to the second circuit node. Where the FET capacitor structures have different gate-source threshold voltages, the number of FET capacitor structures in the on-state may be varied according to the tuning bias voltage, and the capacitance correspondingly tuned to a desired value according to any suitable control algorithm. For RF frequencies exceeding 1 GHz (e.g., 1.6, 2-2.4, 3.5, etc.), the FET capacitor structures may advantageously comprise III-N metal insulator field effect transistor (MISFET) structures operable in depletion mode and/or enhancement mode.

Figure 2A:
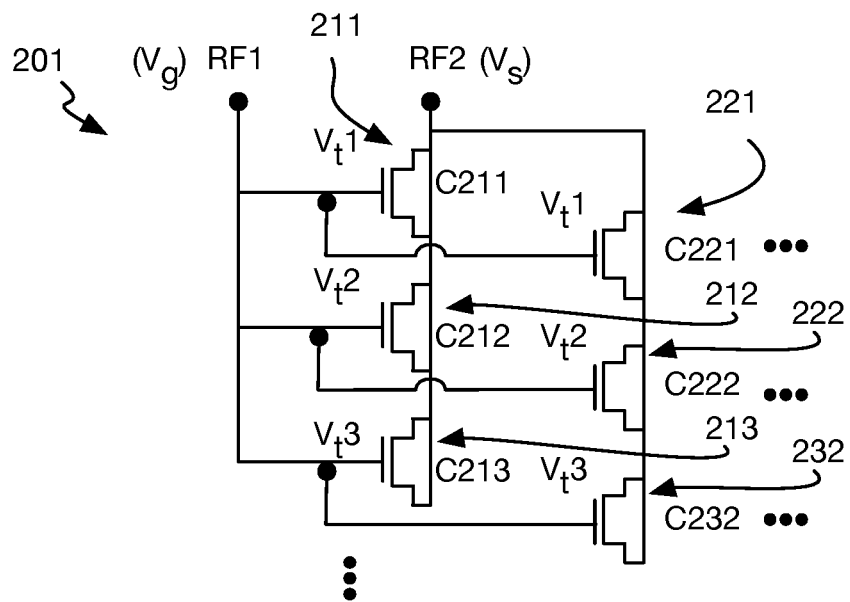
FIG. 2A is a circuit diagram illustrating a FET capacitor IC having a tunable capacitance, in accordance with some embodiments.

FIG. 2A is a circuit diagram illustrating an IC 201 having a tunable capacitance, in accordance with some embodiments. As shown IC 201 comprises a first circuit node RF1 to receive an RF signal, and a second circuit node RF2 to output the RF signal. The RF signal passed by IC 201 may be in the GHz band, for example. The circuit nodes could also be swapped between RF1 and RF2 as the two nodes are coupled to terminals of a capacitor. The first circuit node is capacitively coupled to the second circuit node through a plurality of FET capacitor structures coupled in electrical parallel across the two circuit nodes RF1, RF2. As shown, FET capacitor structures 211, 212, and 213 each include a gate electrode coupled in electrical parallel with each other and coupled to the first circuit node. RF1 is therefore passed into the gate electrodes in this example Although not depicted, the RF1 circuit node may be coupled to each gate electrode through a resistor. Each of FET capacitor structures 211, 212, and 213 further include a source and a drain, both of which are coupled to the second circuit node. Source and drains of the plurality of FET capacitor structures 211-213 are all coupled in electrical parallel with each other to convey the RF signal from their gate electrodes across their respective MOS capacitors, C211, C212, C213. Any integer number of MOS capacitors may be coupled in this manner. The example shown in FIG. 2A illustrates a 2D spatial array of FET capacitor structures that further includes one or more additional rows or columns of FET capacitor structures (e.g., FET capacitor structures 221, 222 and 232).

MOS capacitances C211-C213 (and C221-C232) may all be approximately equal to each other, or vary across the plurality of FETs, for example as a function of variation in the architectures of the individual FET capacitor structures, as further described below. Generally, MOS capacitances C211-C232 may be predetermined for a given FET capacitor structure both for an "off-state" (when the MOS capacitance is at a minimum associated with carrier depletion of the channel semiconductor), and for an "on-state" (when the MOS capacitance is at a maximum associated with carrier accumulation, or inversion, of the channel semiconductor). Total capacitance of IC 201 may therefore be designed to have a desired maximum capacitance associated with an operating condition where all FET capacitor structures are in the on-state, and a minimum capacitance associated with an operating condition where all FET capacitor structures are in the off-state. In accordance with some further embodiments, threshold voltages ($V_t$) of the FET capacitor structures in IC 201 vary. In the example shown in FIG. 2A, FET capacitor structure 211 has a gate-source threshold voltage $V_t1$, while FET capacitor structure 212 has a gate-source threshold voltage $V_t2$, and FET capacitor structure 213 has a gate-source threshold voltage $V_t3$. Since the FET capacitor structures 211-213 are FETs with their source and drain tied together, the term "threshold voltage" as employed herein has the same meaning as for any FET (i.e., the threshold voltage is the minimum gate-to-source voltage $V_{GS}$ that is needed to create a conducting path through semiconductor material between the source and drain terminals, at which point the device is in the "on-state").

Where threshold voltages $V_t1$ $V_t2$, $V_t3$ are unequal, various ones of the FET capacitor structures 211, 212 and 213 may be switched between the off-state and on-state in response to modulation of a tuning bias voltage applied between the circuit nodes RF1 and RF2. Hence, during operation of IC 201, application of a given tuning bias voltage will place a predetermined integer number of the FET capacitor structures into their on-state, reaching an associated intermediate capacitance level between the minimum and maximum capacitance values. Notably, there may be any number of threshold voltages provided by IC 201, and there may be any number of FET capacitor structures having a given threshold voltage. For example, FET capacitor structures 221, 222 and 223 may also have the differing threshold voltages $V_t1$ $V_t2$, $V_t3$, respectively.

Figure 2B:
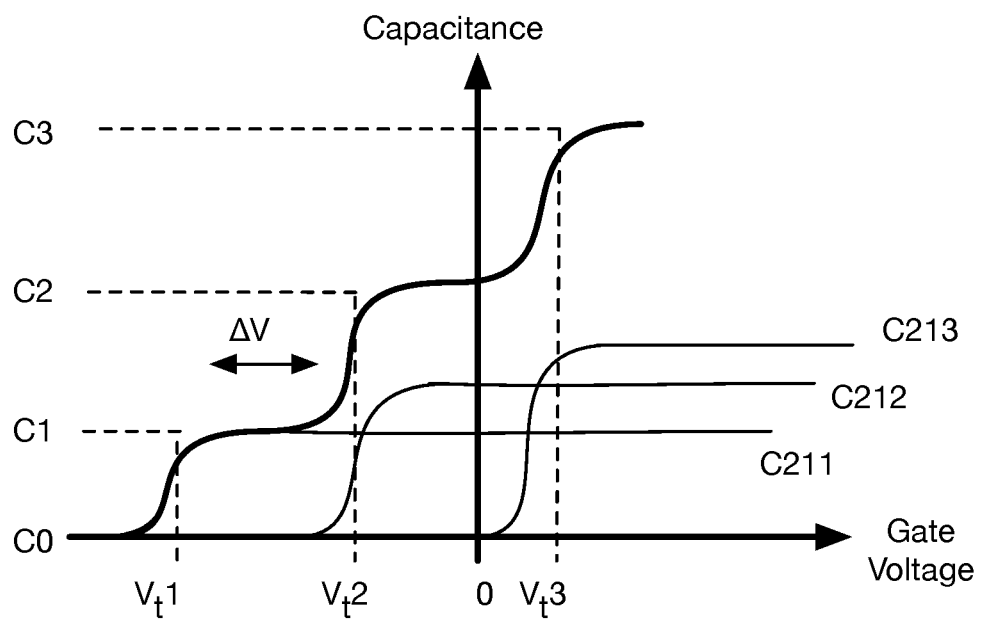
FIG. 2B is a graph illustrating discrete levels of capacitance of the IC illustrated in FIG. 2 as a function of a bias voltage, in accordance with some embodiments.

FIG. 2B is a graph illustrating discrete levels of capacitance achieved by IC 201 as a function of a tuning bias voltage applied to the gate electrodes, in accordance with some embodiments. As shown, four discrete capacitance levels (C0, C1, C2 and C3) are achieved as the tuning bias voltage is swept from a negative value to a positive value. During operation of IC 201, FET capacitor structure 211 (and 221, etc.) may be placed into the on-state in response to the tuning bias voltage satisfying $V_t1$. At this first tuning bias voltage threshold, FET capacitor structures 212, 222, 213 and 232 may all remain in their of-state, for example. For bias tuning voltages below this threshold, the capacitance is at some minimum level C0, which may be associated with all FET capacitor structures of IC 201 being in an off-state, for example. Capacitance may increase according to some sub-threshold response curve and then, at $V_t1$, stabilize at a capacitance level C1 associated with the total MOS capacitance predominantly attributable to those FET capacitor structures of IC 201 that have a threshold voltage $V_t1$ (or lower). In the illustrated example, C1 is approximately equal to capacitance C211, as further illustrated by the thinner solid line.

FET capacitor structure 212 (and 222, etc.) may then be placed into the on-state in response to the tuning bias voltage satisfying $V_t2$. At this next incremental tuning bias voltage threshold, FET capacitor structure 213 (and 232, etc.) may remain in the off-state while FET capacitor structure 211 (and 221) remains in the on-state. Capacitance of IC 201 increases at $V_t2$ to flatten out at capacitance level C2 associated with the total MOS capacitance now predominantly attributable to the FET capacitor structures of IC 201 that have a threshold voltage $V_t2$, or lower. In this example, the total MOS capacitance is the sum of MOS capacitance C211 and MOS capacitance C212. The increment from capacitance level C1 to capacitance level C2 is arbitrary being a function of number of additional FET capacitor structures entering their on-state, and the incremental MOS capacitance associated with each additional FET capacitor structure. Notably, capacitance level C1 has a plateau of a width ΔV, which is a function of the amount of separation between $V_t1$ and $V_t2$, as the next threshold voltage increment. Each capacitance level of IC 201 may therefore remain substantially flat over a certain tuning bias voltage range that makes the capacitance tolerant of drift or noise in the tuning bias voltage. For example, if a tuning bias voltage approximately half way between thresholds $V_t1$ and $V_t2$ is selected as an operating point, any bias voltage modulation amounting to less than ½ΔV would not significantly alter the capacitance of IC 201.

As further illustrated in FIG. 2B, FET capacitor structure 213 (and 223, etc.) may be placed into the on-state in response to the tuning bias voltage satisfying $V_t3$. At this next incremental tuning bias voltage threshold, all FETs capacitively coupling the RF1 circuit node to the RF2 circuit node may now be in the on-state. Capacitance of IC 201 therefore increases at $V_t3$ to capacitance level C3 associated with the total MOS capacitance attributable to the FETs of IC 201 that have a threshold voltage $V_t3$, or lower. In this example, the total MOS capacitance is the sum of MOS capacitances C211, C212, and C213).

Being a function of FET threshold voltage, the tuning bias voltage range may be advantageously designed, for example to be significantly less than that typical for tunable ferroelectric capacitors. In some such embodiments, tuning bias voltage range is set to be less than 10V. Hence, a population of FET capacitor structures employed in IC 201 may be designed to have a gate-source threshold voltage that spans some voltage range less than 10V. Depending on the number of capacitance levels desired, each level may therefore be substantially constant over some ΔV. In some embodiments, the tuning bias voltage range spans 0V with at least one of the FET capacitor structures being operable in an enhancement mode that is in an off-state at 0V. In the example illustrated in FIG. 2A-2B, FET capacitor structure 213 has an n-type enhancement mode MOS structure which is enters the on-state at some positive voltage (e.g., $V_t3$ may be at approximately IV), while FET capacitor structures 211 and 212 both have n-type depletion mode MOS structures that enter the off-state only when the gate voltage ($V_G$) is pulled sufficiently negative relative to the source voltage ($V_S$). For example, $V_t2$ may be approximately −3V while $V_t1$ may be approximately −6V. IC 201 may therefore operate with some default capacitance level C2 under a zero voltage tuning bias. Capacitance of IC 201 may be decreased to a lower capacitance levels (e.g., C1 or C0) in response to an increasingly negative tuning bias, and capacitance of IC 201 may be increased to a higher capacitance level (e.g., C3) in response to an increasing positive tuning bias.

In some embodiments, FET capacitor structures of a tunable capacitance IC comprise a Group III nitride (i.e., III-N) semiconductor material. III-N semiconductors have the advantage of high carrier (e.g., electron) mobility and a wide band gap suitable for sustaining high breakdown voltages (e.g., $BV_{DS}$). The high carry mobility may enable the FET capacitor structures to operate throughout the GHz band (e.g., 1.6 GHz, 2-2.4 GHz, 3.5 GHz, etc.), and even into THz frequencies. The high breakdown voltage may enable the FET capacitor structures to sustain high RF signal power without placing them in series, or incurring excessively large IC footprints. Another advantage is that an RFFE (e.g., a power amp circuit) may further employ III-N FETs, enabling the input/load matching circuitry to be integrated with the same RFFE using the same device and fabrication technologies.

In advantageous embodiments, the FET capacitor structures implementing a tunable capacitor within an IC comprise a metal-insulator-semiconductor (MIS) architecture that include a gate dielectric between a gate electrode and a III-N semiconductor. In alternative embodiments, the FET capacitor structures implementing a tunable capacitor circuit comprise a metal-semiconductor (MES) architecture. However, since a MESFET device architecture can suffer high gate leakage current at low forward bias voltages where the metal-semiconductor (Schottky) junction turns "on," the MIS architecture can avoid the diodic behavior of the MES architecture with gate leakage current increasing significantly only upon breakdown of the gate dielectric.

In accordance with some further embodiments, FET-level structural differences within a plurality of FET capacitor structures may be employed to vary the threshold voltages of the FET capacitor structures to implement tunable MOS capacitance circuitry substantially in the manner described above. In some advantageous embodiments, the FET-level structural differences comprise at least one of a thickness of a polarization layer between the gate electrode and a semiconductor channel region (i.e., gate recess), gate dielectric material composition(s) or thickness(es), III-N semiconductor material composition(s) or thickness(es), or gate electrode material composition(s).

In some embodiments, gate electrodes of FET capacitor structures implementing a tunable capacitor include differing amounts of gate recess. Threshold voltage of a MISFET is a strong function of the amount by which a gate electrode is recessed into one or more III-N material proximate to the semiconductor channel region. The gate recess may be varied across a plurality of FET capacitor structures to vary their threshold voltages sufficiently to encompass both depletion and enhancement modes of operation. Varying the gate recess across a plurality of FET capacitor structures may provide a menu of threshold voltages suitable for implementing tunable MOS capacitors having a number of discrete capacitance levels.

Figure 3:
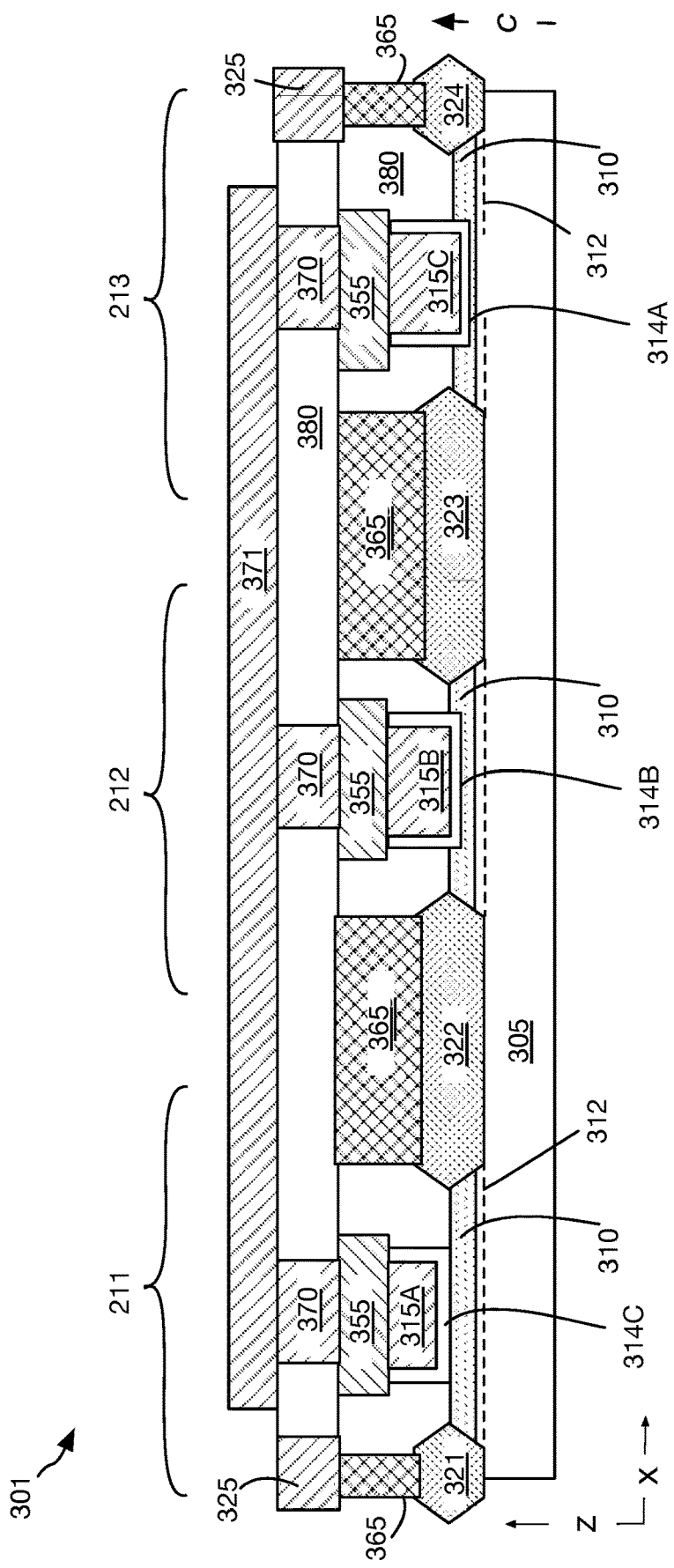
FIG. 3 is a cross-sectional profile view of an IC with a plurality of III-N FET capacitor structures, in accordance with some embodiments.

FIG. 3 is a cross-sectional profile view of an IC region 301 that includes a plurality of III-N FET capacitor structures, in accordance with some embodiments where gate recess is modulated across the plurality. As shown, IC region 301 includes three representative structures corresponding to III-N FET capacitor structures 211, 212 and 213 that were introduced above in the context of IC 201. In some embodiments, IC region 301 is a portion of IC 201. IC region 301 may be over any suitable substrate (not depicted). In some embodiments, the substrate is crystalline SiC. In other embodiments, the substrate is a cubic semiconductor, such as monocrystalline silicon. For such embodiments, IC region 301 may be formed over a cubic substrate surface, such as a (100) surface. III-N crystals may also be grown on other surfaces (e.g., 110, 111, miscut or offcut, for example 2-10° toward [110] etc.). IC region 301 may also be over a host substrate material to which the III-N crystal has been bonded. For such embodiments, the host substrate may be crystalline, or not (e.g., glass, polymer, etc.).

IC region 301 includes a first III-N material 305 and a second III-N material 310. III-N materials 305 and 310 may each have substantially monocrystalline microstructure (e.g., hexagonal Wurtzite). Although monocrystalline, it is noted that crystal quality of III-N crystalline materials may vary dramatically, for example as a function of the techniques employed to form materials 305 and 310, and the substrate upon which they are formed. In some exemplary embodiments, dislocation density with III-N material 305 is in the range of $10^6$-$10^{11}$/cm$^2$. FIG. 3 illustrates crystal orientations of III-N materials 305 and 310, in accordance with some embodiments where the thickness of the materials along a c-axis of the crystal is approximately on the z-axis, substantially orthogonal to a plane of an underlying substrate. In this orientation, the crystal structure of III-N materials 305 and 310 lack inversion symmetry with the (0001) and (000-1) planes not being equivalent. In illustrated embodiments, III-N materials 305 and 310 may be characterized as having +c polarity with the c-axis extending in the <0001> direction.

III-N material 305 comprises nitrogen as a first majority lattice constituent, and has a second majority lattice constituent including one or more elements from Group III of the Periodic table. III-N material 305 may be any III-N material known to be suitable as a transistor channel material. In some embodiments, III-N material 305 is a binary alloy (e.g., GaN, AlN, InN). In some such embodiments, which have an advantageously high carrier mobility, III-N material 305 is binary GaN. In some other embodiments, III-N material 305 is a ternary alloy (e.g., $Al_xIn_{1-x}N$, $In_xGa_{1-x}N$, or $Al_xGa_{1-x}N$). In still other embodiments, III-N material 305 is a quaternary alloy (e.g., $In_xGa_yAl_{1-x-y}N$). III-N material 305 may have any impurity dopants. However, in some advantageous embodiments, III-N material 305 is intrinsic and not intentionally doped with impurities associated with a particular conductivity type. For example, intrinsic impurity (e.g., Si) level in III-N material 305 may be advantageously less than 1e17 atoms/cm$^3$, and in some embodiments is between 1e14 and 1e16 atoms/cm$^3$.

III-N material 310 also comprises nitrogen as a first majority lattice constituent, and has a second majority lattice constituent including one or more elements from Group III of the Periodic table. III-N material 310 may be any III-N material known to be suitable as a polarization material for III-N material 305. III-N material 310 may comprise any alloy distinct from that of III-N material 305 suitable for modulating the polarization field strength (e.g., spontaneous and/or piezoelectric) between these two III-N materials. Where spontaneous and/or piezoelectric polarization field strengths are sufficiently different between III-N material 305 and III-N material 310, a two-dimensional charge carrier sheet (e.g., 2D electron gas or "2DEG" 312) is formed within III-N material 305 in the absence of any externally applied field. The 2DEG can be expected to be present in III-N material 305 and located within a few nanometers of the heterojunction with III-N material 310. III-N material 310 may therefore be referred to in functional terms as a "polarization layer" as it induces a polarization charge into the heterostructure. In some embodiments, III-N material 310 comprises a binary alloy (e.g., GaN, AlN, InN). In some other embodiments, III-N material 310 comprises a ternary alloy (e.g., $Al_xIn_{1-x}N$, $In_xGa_{1-x}N$, or $Al_xGa_{1-x}N$). In still other embodiments, III-N material 310 comprises a quaternary alloy (e.g., $In_xGa_yAl_{1-x-y}N$). In some embodiments, III-N material 310 has a greater amount of Al than does III-N material 305. In some such embodiments, III-N material 310 includes a layer of binary AlN. In further embodiments, III-N material 310 comprises multiple material layers, each of which may have a distinct III-N alloy composition.

III-N materials 305 and 310 are incorporated into each of FET capacitor structures 211, 212 and 213. Individual ones of FET capacitor structures 211-213 further include a source and a drain coupled to III-N material 305 on opposite sides of a gate stack that over a portion of III-N material 305 and/or 310. The gate stack includes a gate electrode along with a gate dielectric. As noted above, the source and drains of each of FET capacitor structures 211-213 may be coupled together to one circuit node, which, during operation, may be biased at a reference voltage (e.g., source voltage $V_S$) while the gate electrodes of each FET 211-213 may be biased at a gate voltage $V_G$ suitable for controlling conduction through a channel portion of each FET. Since the source and drain terminals are tied together, they are both referred to herein simply as a "semiconductor terminal."

In some exemplary embodiments, two or more FET capacitor structures are electrically coupled together through their semiconductor terminals. In the embodiments illustrated by FIG. 3, FET capacitor structure 211 includes a semiconductor terminal 321 and a semiconductor terminal 322. FET capacitor structure 212 also comprises semiconductor terminal 322. Semiconductor terminal 322 therefore directly connects the two FET capacitor structures 211 and 212. FET capacitor structure 212 further includes a semiconductor terminal 323. FET capacitor structure 213 also comprises semiconductor terminal 323. Semiconductor terminal 323 therefore directly connects the two FET capacitor structures 212 and 213. FET capacitor structure 213 further comprises a semiconductor terminal 324. While local terminal interconnect by semiconductor material is a space-efficient means of coupling a terminal of each of FET capacitor structures 211-213 together to a common circuit node, FET capacitor terminals may also be less directly interconnected through a metallization level. For example, in FIG. 3 interconnect metallization 325 may couple semiconductor terminal 321 to semiconductor terminal 324. Although out of the plane of FIG. 3, interconnect metallization 325 may be further coupled to semiconductor terminal 322 and to semiconductor terminal 323, for example through contact metallization 365. As such, all semiconductor terminals 321-324 may be electrically tied to a single circuit node.

The semiconductor terminals 321-324 may each extend through III-N material 310, and land on, or be embedded within, III-N material 305. In the illustrated example, semiconductor terminals 321-324 are each in physical contact with a c-plane (e.g., Ga-face) of III-N material 305. Semiconductor terminals 321-324 each have access to charge carriers within some nanometers of the heterojunction between and III-N materials 305 and 310. The junctions between III-N material 305 and semiconductor terminals 321-324 may be homojunctions or heterojunctions. In some embodiments, semiconductor terminals 321-324 are also III-N material(s). For example, semiconductor terminals 321-324 may be InGaN. Some advantageous InGaN embodiments include 5-20% In ($In_xGa_{1-x}N$ with 5%≤x≤20%). Semiconductor terminals 321-324 may have an alloy composition that is constant or graded over their thickness between III-N material 305 and contact metallization 365. For some embodiments, semiconductor terminals 321-324 are epitaxial, having the same crystallinity and orientation as III-N material 305. Exemplary hexagonal crystal facets are illustrated in FIG. 3. For some other embodiments, semiconductor terminals 321-324 are polycrystalline, in which case crystal facets may not be as readily apparent.

Semiconductor terminals 321-324 may be impurity doped to a desired conductivity type (e.g., with Si for n-type). The doping level of semiconductor terminals 321-324 is advantageously as high as practical for lowest terminal/access resistance. The doping level may be at least an order of magnitude higher than that of III-N material 305, for example. In some exemplary embodiments where semiconductor terminals 321-324 are a III-N alloy, the impurity dopant level is over 1e19 atoms/$cm^3$, and more advantageously over 1e20 atoms/$cm^3$. Si is one exemplary dopant atom for which such high (N+) doping levels may be achieved in III-N alloys. An alternative N-type dopant is Ge.

FET capacitor structures 211, 212 and 213 further include gate terminals that are electrically interconnected to a single (common) circuit node. In the example shown, an interconnect metallization 371 couples three gate electrodes 315A, 315B and 315C in electrical parallel, for example through conductive vias 370. FET capacitor structure 211 includes a first gate stack comprising gate electrode 315A, and a gate dielectric 314C. FET capacitor structure 212 includes a second gate stack comprising gate electrode 315B, and a gate dielectric 314B. FET capacitor structure 213 includes a third gate stack comprising gate electrode 315C, and a gate dielectric 314C. FIG. 3 illustrates three different amounts of gate recess with FET capacitor structure 213 having the most gate recess and FET capacitor structure 211 having the least.

For FET capacitor structure 213, gate electrode 315C is located within a recess in the underlying III-N material that extends a depth (e.g., z-dimension) through a first (largest) thickness of III-N material 310. While gate electrode 315C may be recessed completely through III-N material 310, in some advantageous embodiments III-N material 310 has a non-zero c-axis thickness below gate dielectric 314C. The recess depth into III-N material 310 may be predetermined to set $V_t3$ associated with FET capacitor structures 213. With gate electrode 315C recessed, polarization layer thickness is insufficient to sustain a 2DEG 312 immediately below the gate stack at zero volts $V_G$, as illustrated by the absence of negative charge carriers within the channel region. FET capacitor structure 213 is therefore operable for an enhancement mode modulation of 2DEG 312 to control the amount of capacitive coupling between its semiconductor terminals 323,324 and gate electrode 315C.

For FET capacitor structure 212, gate electrode 315B is located within a recess in the underlying III-N material that extends another depth through a lesser thickness of III-N material 310. III-N material 310 has a non-zero c-axis thickness between gate dielectric 314B and III-N material 305. The recess depth into III-N material 310 is set to differ from that of FET capacitor structure 213, and may be predetermined to set Vt2 associated with FET capacitor structure 212. With gate electrode 315C somewhat less recessed, 2DEG 312 is sustained even below the gate stack at zero $V_G$, as illustrated. FET capacitor structure 212 is therefore operable for depletion mode modulation of 2DEG 312 to control the magnitude of capacitive coupling between its semiconductor terminals 322, 323 and gate electrode 315B.

For FET capacitor structure 211, gate electrode 315A is not recessed into the underlying III-N material. III-N material 310 therefore has some larger non-zero c-axis thickness below gate dielectric 314A. With no recess, FET capacitor structure 211 will again be operable for depletion mode modulation of 2DEG 312, and will have a threshold voltage $V_t3$ where capacitive coupling between its semiconductor terminals 321, 322 and gate electrode 315A becomes most significant.

With gate recess varying across FET capacitor structures 211-213, MOS capacitance associated with each FET capacitor structure may also vary. For example, if all other parameters are substantially the same across FET capacitor structures 211-213, FET capacitor structure 213 can be expected to have the largest MOS capacitance as gate electrode 315C is the most recessed and in closest proximity to 2DEG 312. FET capacitor structure 212 may similarly have a MOS capacitance that is somewhat larger than that of FET capacitor structure 211. The increments in MOS capacitance associated with $V_t1$, $V_t2$ and $V_t3$ may therefore differ unless other parameters (e.g., channel width and/or length) are also varied accordingly. The number of FET capacitor structures having $V_t1$ may also differ from the number of FET capacitor structures having $V_t2$, and each may further differ from the number of FET capacitor structures having $V_t3$, etc. To provide fixed capacitance increments, an IC may, for example, include more and/or larger FET capacitor structures 211 than FET capacitor structures 212, and/or more and/or larger FET capacitor structures 212 than FET capacitor structures 213, for example.

In accordance with some embodiments herein, at least one of a gate electrode or gate dielectric composition is modulated, or made different across a plurality of FET capacitor structures employed in a tunable capacitance circuit. Such structural variation(s) may be in addition to the gate recess modulation described above, or in the alternative to the gate recess modulation described above. Where combined with gate recess modulation, a wider range of threshold voltages may be achieved, or a MOS capacitance for a FET capacitor structure having a first threshold voltage may be matched with that of a FET capacitor structures having another threshold voltage. For example, a first FET capacitor structure with a greater gate recess that would otherwise have somewhat larger MOS capacitance than a second FET capacitor structure with less gate recess could further include a gate dielectric having a higher EOT than the second FET capacitor structure.

Material composition and/or thickness of a given gate dielectric material may be varied across multiple FET capacitor structures. For example, in further reference to FIG. 3, gate dielectric 314A may be different than gate dielectric 314B, and/or different than gate dielectric 314C. Gate dielectrics may be compositionally varied by supplementing a first gate dielectric material employed within a first III-N FET capacitor structure with a second dielectric material such that a second III-N FET capacitor structure may then include both the first and second dielectric material within a gate dielectric stack. Layered gate dielectric stacks are not limited to two material layers or lamella, and may instead comprise any number of material layers (e.g., three, or more). Alternatively, gate dielectric materials may be made different by using a first gate dielectric material within a first III-N FET capacitor structure and a second, different, dielectric material in a second III-N FET capacitor structure. In other embodiments, a first III-N FET capacitor structure may use any combination of gate material layers in a first gate dielectric stack while a second III-N FET capacitor structure may use of any other (different) combination of gate material layers in a second gate dielectric stack. For any of these embodiments, gate dielectric material(s) employed in a first III-N FET capacitor structure may have different thickness(es) from gate dielectric materials employed in a second III-N FET capacitor structure.

Gate dielectric materials may be selected to modulate threshold voltage ($V_t$). Depending on the gate dielectric material employed, the inventors have observed anywhere from 100 mV to a 5V swing in MOS threshold voltage, spanning 0V. Notably, this $V_t$ swing is attributable to the gate dielectric, not the gate electrode composition or III-N semiconductor composition (e.g., doping or alloy). Hence, while the gate electrode metal-to-semiconductor workfunction difference may also have an impact on $V_t$, the threshold voltage of a III-N FET capacitor structure may be tuned through modulation of the gate dielectric even where the gate electrode material remains fixed. For example, a gate dielectric material composition that introduces more fixed charge can shift the threshold voltage of a III-N FET capacitor structure relative to that of another that has a gate dielectric material associated with lower fixed charge (but is otherwise substantially the same). Each of gate dielectrics 314A-314C may have any composition suitable for the purpose, such as, but not limited to, silicon dioxide, silicon nitride, silicon oxynitride, and materials having a higher relative permittivity than silicon nitride (i.e., "high-k" dielectrics). Some examples of high-k dielectrics include metal oxides (i.e., comprising a metal and oxygen), such as, but not limited to aluminum oxides, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, tantalum oxide, tantalum silicon oxide, lead scandium tantalum oxide, and lead zinc niobate. Gate dielectric material 331 and gate dielectric material 332 may each have any suitable thickness. In some embodiments, gate dielectric material 331 and gate dielectric material 332 each has a thickness in the range of 3-50 nm.

Gate electrode compositions may also be fixed or varied across plurality of FET capacitor structures employed to provide tunable MOS capacitance. In further reference to FIG. 3, the compositions of gate electrodes 315A, 315B and 315C may be any known to be suitable for the purpose. In some embodiments, where III-N material 305 is binary GaN, an exemplary gate electrode may include at least one of Ni, W, Pt, or TiN. Each of these metals or metallic compounds may be associated with a particular work function (or metal-semiconductor work function difference) that may have some impact on threshold voltage. In some embodiments, gate electrodes 315A-315C have substantially the same composition in reliance upon gate recess and/or gate dielectric modulation for threshold voltage variation. In other embodiments, gate electrodes 315A-315C have different compositions.

As further illustrated in FIG. 3, one or more dielectric materials 380 may provide electrical isolation between FET capacitor structures 211-213, and/or provide surface passivation of III-N materials 305 and/or 310 not covered by a gate stack or semiconductor terminal. For example, dielectric material(s) 380 may have any composition known in the art to reduce dangling bonds and/or other surface defect states in III-N materials that may result in high transistor leakage currents. In some examples, dielectric material(s) 380 includes silicon and oxygen (e.g., silicon oxides or silicon oxynitrides). In some examples, dielectric material(s) 380 includes silicon and nitrogen (e.g., silicon oxynitrides or silicon nitride). In other embodiments, dielectric material(s) 380 includes a metal and oxygen (e.g., aluminum oxide, hafnium oxide, or titanium oxide). In still other examples, dielectric material(s) 380 comprise another III-N material, such as AlN, or another alloy for example having a wider bandgap than that of III-N material 310. Dielectric material(s) 380 may therefore have any microstructure (e.g., amorphous, polycrystalline or monocrystalline). Dielectric material(s) 380 may comprise separate material layers and/or structural features (e.g., sidewall spacers), for example as further described elsewhere herein.

Figure 4:
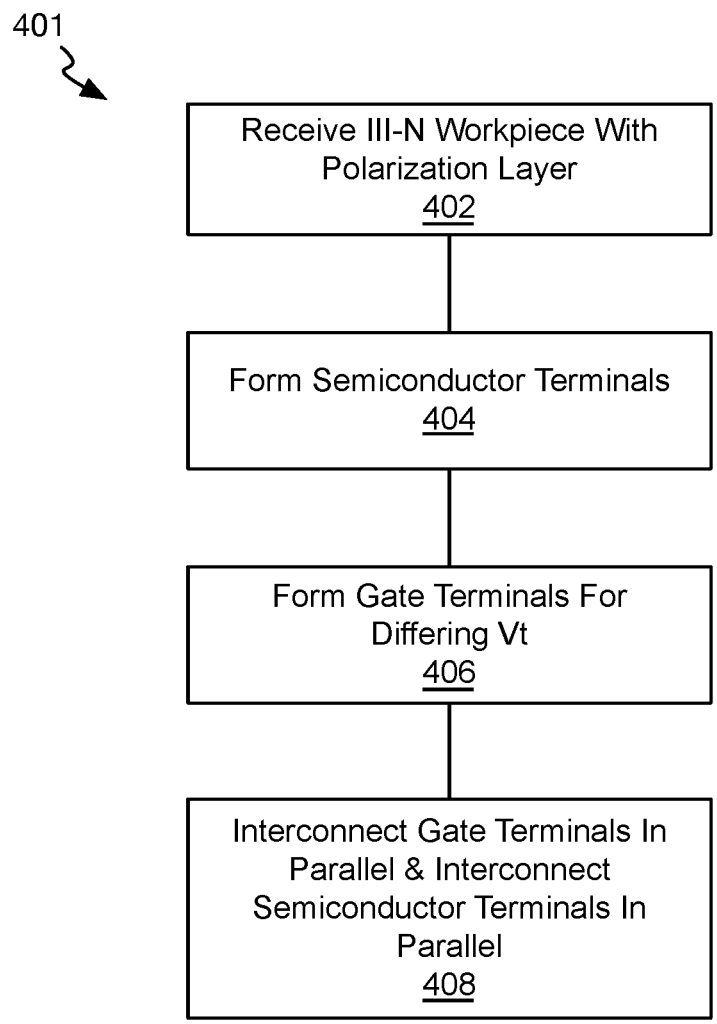
FIG. 4 is a flow diagram illustrating methods of forming the III-N FET capacitor structures illustrated in FIG. 3, in accordance with some embodiments.

The FET capacitor structures and tunable capacitance IC described above may be fabricated according to a variety of techniques. FIG. 4 is a flow diagram illustrating methods 401 for forming an IC with tunable MOS capacitance that includes III-N FETs having differing threshold voltages, in accordance with some embodiments.

Figure 5A:
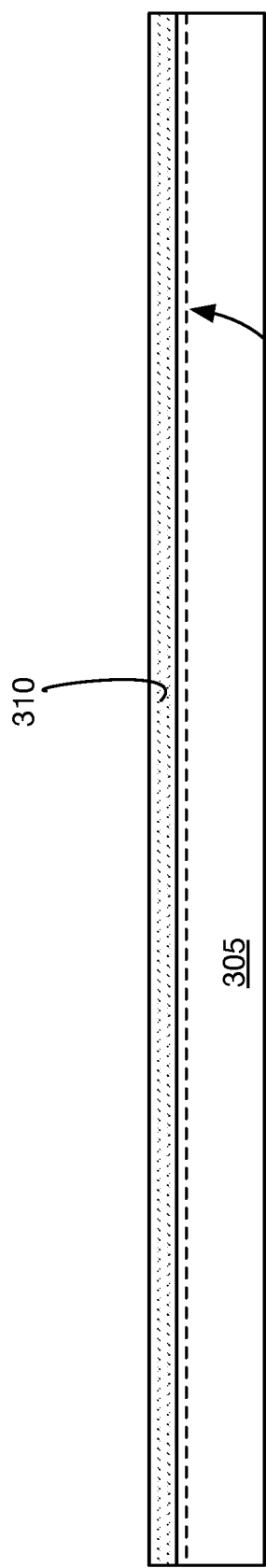

Methods 401 begin with receiving a workpiece at operation 402. Various epitaxial growth processes and/or fabrication processes may be employed upstream of methods 401 to prepare the workpiece received at operation 402. For some advantageous embodiments, the workpiece received at operation 402 comprises a substrate of crystalline group-IV materials (e.g., Si, Ge, SiGe). In some embodiments, the substrate received is a substantially monocrystalline (111) silicon substrate. Lattice mismatch between silicon and III-N crystals is most easily accommodated for the (111) plane. Nevertheless, other crystallographic orientations having greater lattice mismatch are also possible, such as, but not limited to, the (100), or (110) plane. A substrate may be bulk semiconductor or may be semiconductor on insulator (SOI). Substrate materials other than silicon are also possible, with examples including silicon carbide (SiC), sapphire, a III-V compound semiconductor (e.g., GaAs, InP). Substrates may have any level of impurity doping. Depending on the substrate, the workpiece received at operation 402 may include any number and/or thicknesses of III-N material layers. For example, the workpiece may include any III-N buffer architecture known to be suitable for the substrate, and may further include a III-N material layer known to be suitable as a transistor channel material, such as any of those described above. Over the channel material, the workpiece further includes any III-N material layer known to be suitable as a polarization material, such as any of those described above. FIG. 5A illustrates a portion of one exemplary workpiece that includes III-N material 310 over III-N material 305. The illustrated portion may be electrically isolated from other portions of the workpiece, for example with any shallow trench isolation (STI) process known in the art (not depicted).

Figure 5B:
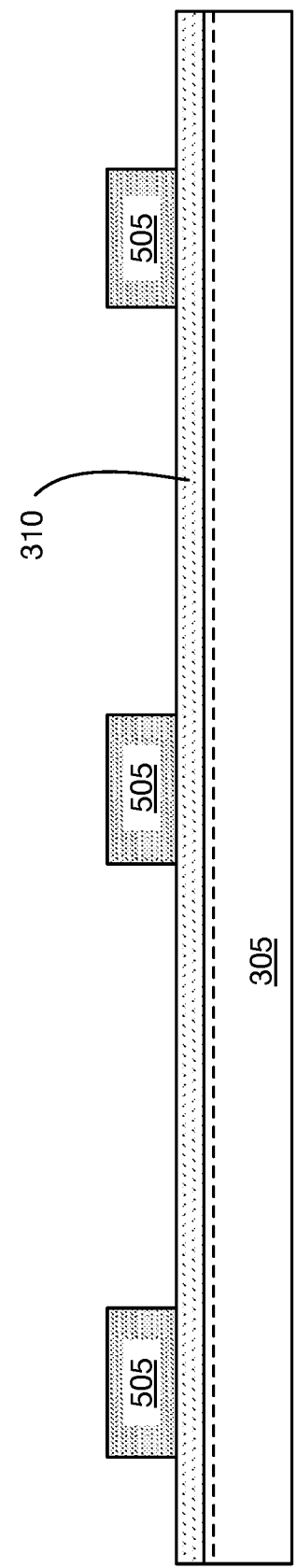
Figure 5C:
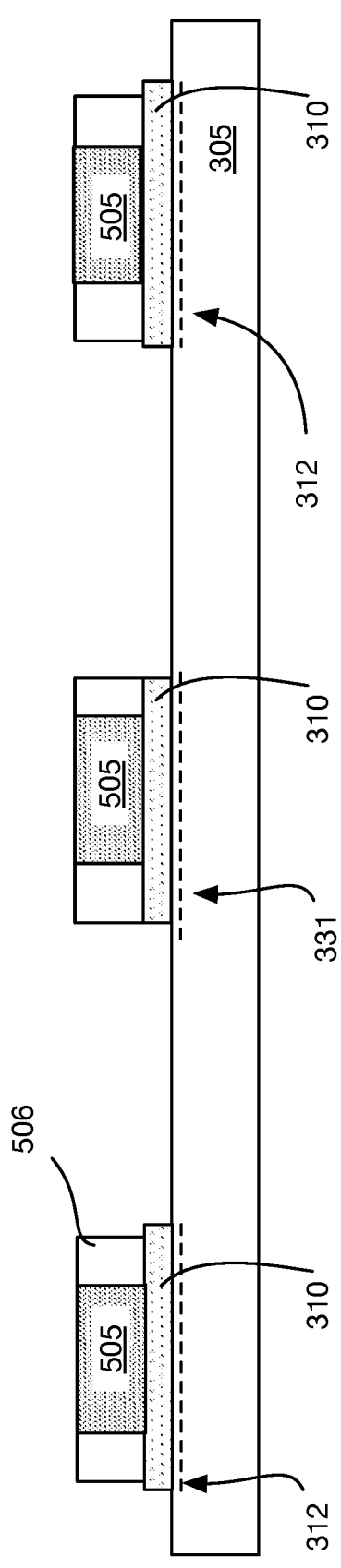
Figure 5D:
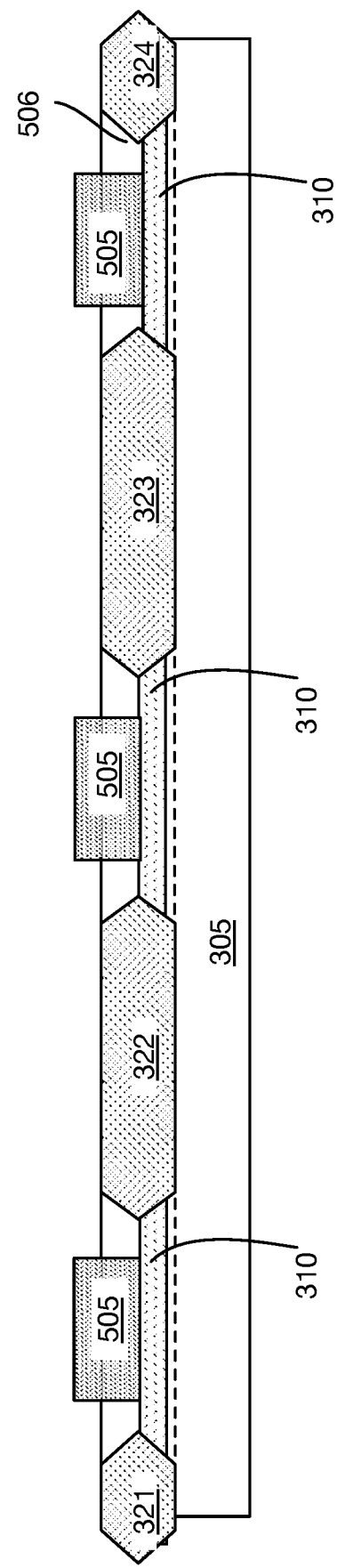

Returning to FIG. 4, methods 401 continue at operation 402 where the transistor semiconductor terminals are formed according to any suitable techniques. In the examples shown in FIG. 5B-5D, a sacrificial gate patterning process is employed to define gate terminal regions, and semiconductor terminal regions. As shown in FIG. 5B, sacrificial gate 505 is patterned, for example with any masking and etching process known to be suitable for the chosen sacrificial material. Masking may comprise hardmasks and/or photo-definable materials. Etching may comprise wet chemical or dry (plasma) etch processes, for example. As further shown in FIG. 5C, a gate sidewall spacer 506 is formed adjacent to a sidewall of sacrificial gate 505. Gate sidewall spacer 506 may be have any composition with some examples being dielectrics, such as, but not limited to, those comprising silicon, oxygen and/or nitrogen (e.g., SiO, SiN, SiON). As further illustrated in FIG. 5C, III-N material 310 is patterned, for example in alignment with an outer edge or sidewall of gate spacer 506. Any wet chemical or dry etch process known to be suitable for III-N material 310 may be employed, for example to reveal III-N material 305, and/or etch into III-N material 305 to reveal a sidewall that intersects 2DEG 312. To arrive at the structures illustrated in FIG. 5D, semiconductor material, such as any of those described above, may then be deposited or epitaxial grown within the openings where III-N material 305 was exposed.

Figure 5E:
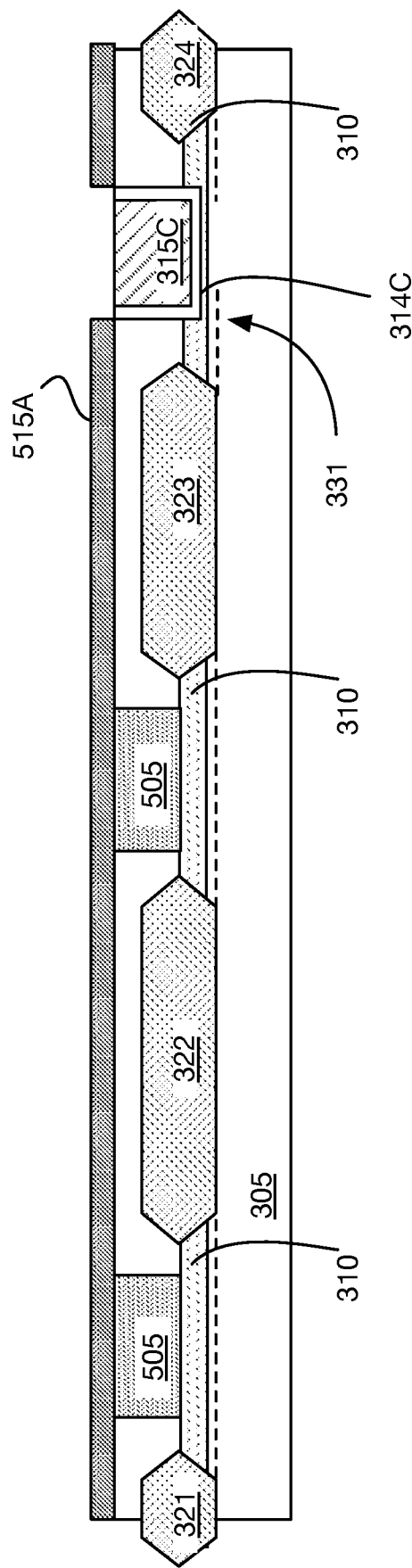

Returning to FIG. 4, methods 401 continue at operation 406 where a gate terminals are formed in a manner that provides FET structures with differing threshold voltages. In the exemplary embodiments further illustrated in FIG. 5E-5G, gate recesses are patterned into the polarization material layer, targeting different depths for different FET structures. As shown in FIG. 5A, a first gate stack including both gate dielectric 314C and gate electrode 315C has been formed by patterning a mask 515A that exposes at least one sacrificial gate 505 to any suitable gate replacement process that includes etching through at least a partial thickness of III-N material 310. III-N material 310 may be removed, for example with an etch process similar to that employed at operation 404, albeit for a shorter process time targeted, for example, to achieve a first desired threshold voltage. Gate dielectric 314C and gate electrode 315C may then be deposited into the gate recess with any technique(s) suitable for their compositions (e.g., chemical vapor deposition, atomic layer deposition, etc.). Overburden from formation of the first gate stack may be subsequently removed, for example, with a planarization process that exposes mask 515A.

Figure 5F:
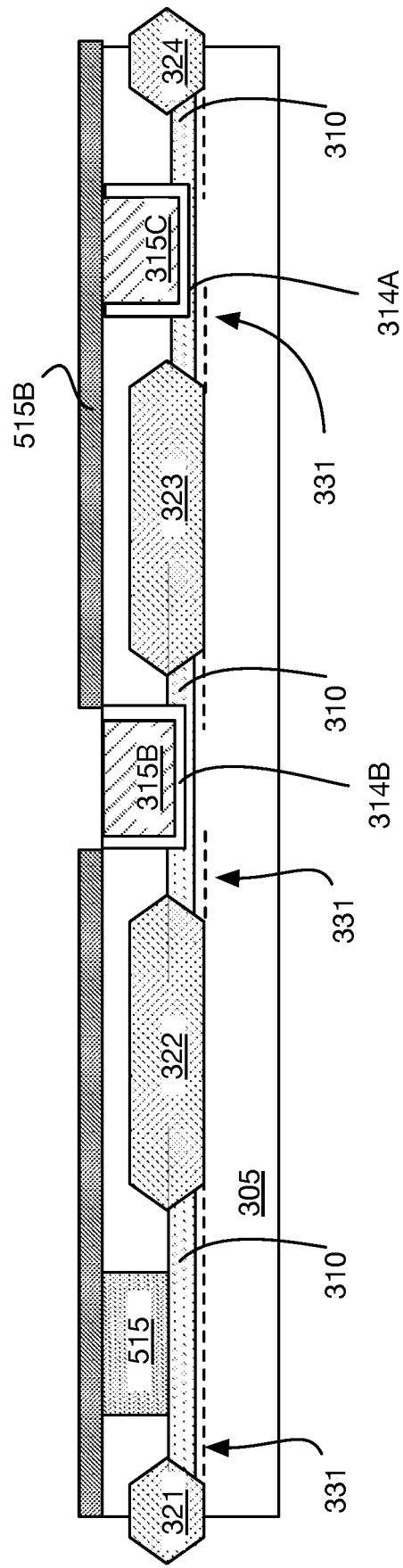

Mask 515A is then replaced with a mask 515B that is patterned to expose at least one other sacrificial gate 505, as further illustrated in FIG. 5F. Another gate stack including gate dielectric 314B and gate electrode 315B is then formed with any suitable gate replacement process. During gate replacement, III-N material 310 may be etched to recess the gate stack by another amount, for example to achieve a second desired threshold voltage. Gate dielectric 314B and gate electrode 315B may be deposited into the gate recess with any techniques suitable for their composition. Overburden from formation of the next gate stack may be subsequently removed, for example, with a planarization process that exposes mask 515B.

Figure 5G:
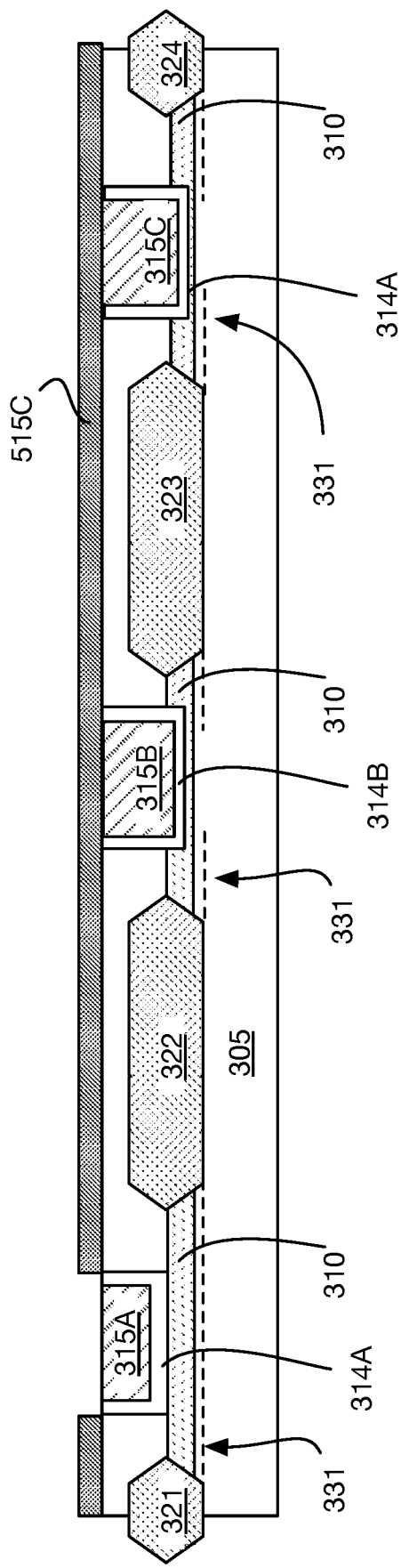
Figure 5H:
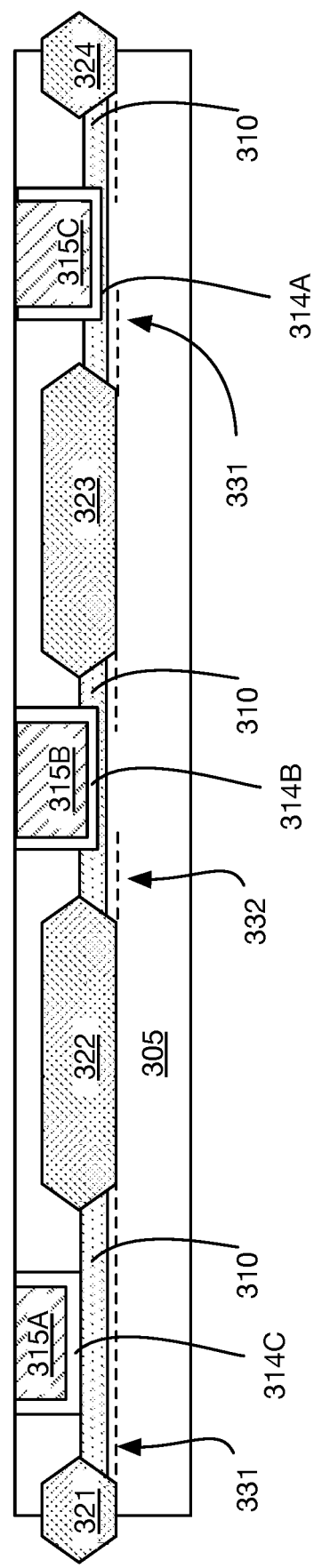

Mask 515B is then replaced with a mask 515C that is patterned to expose at least one other sacrificial gate 505, as further illustrated in FIG. 5G. Another gate stack including gate dielectric 314A and gate electrode 315A is then formed with any suitable gate replacement process. During gate replacement, III-N material 310 need not be etched to recess the gate stack, for example to achieve a third desired threshold voltage. Gate dielectric 314A and gate electrode 315A may be deposited with any techniques suitable for their composition. Overburden from formation of the next gate stack may then be removed, for example, with a planarization process that exposes mask 515B. Mask 515B may then be stripped to arrive at the structures substantially as illustrated in FIG. 5H.

Figure 5K:
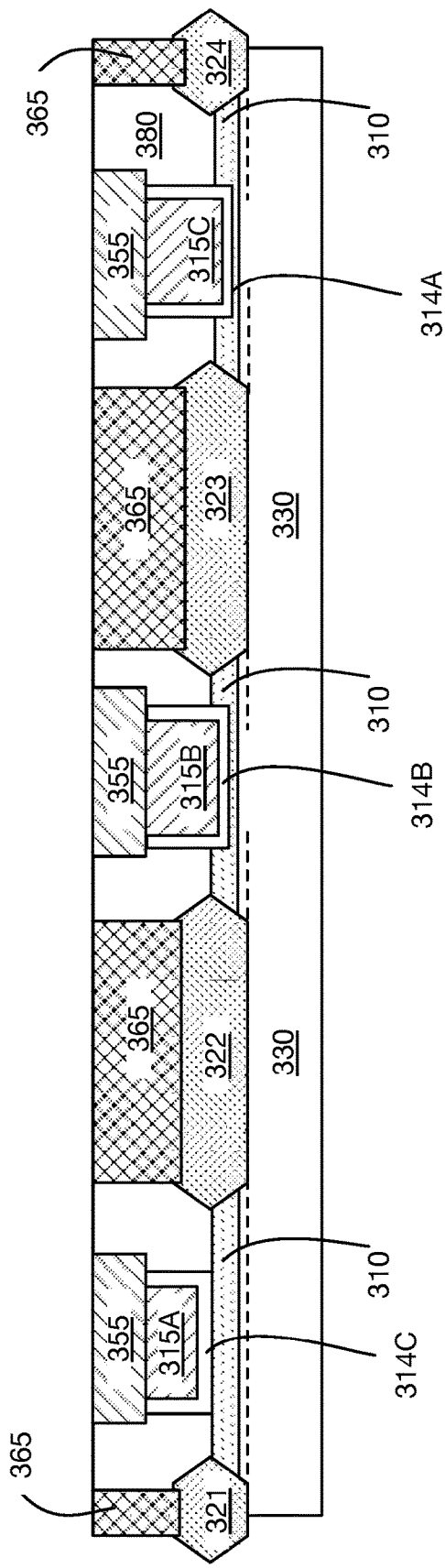
Figure 5L:
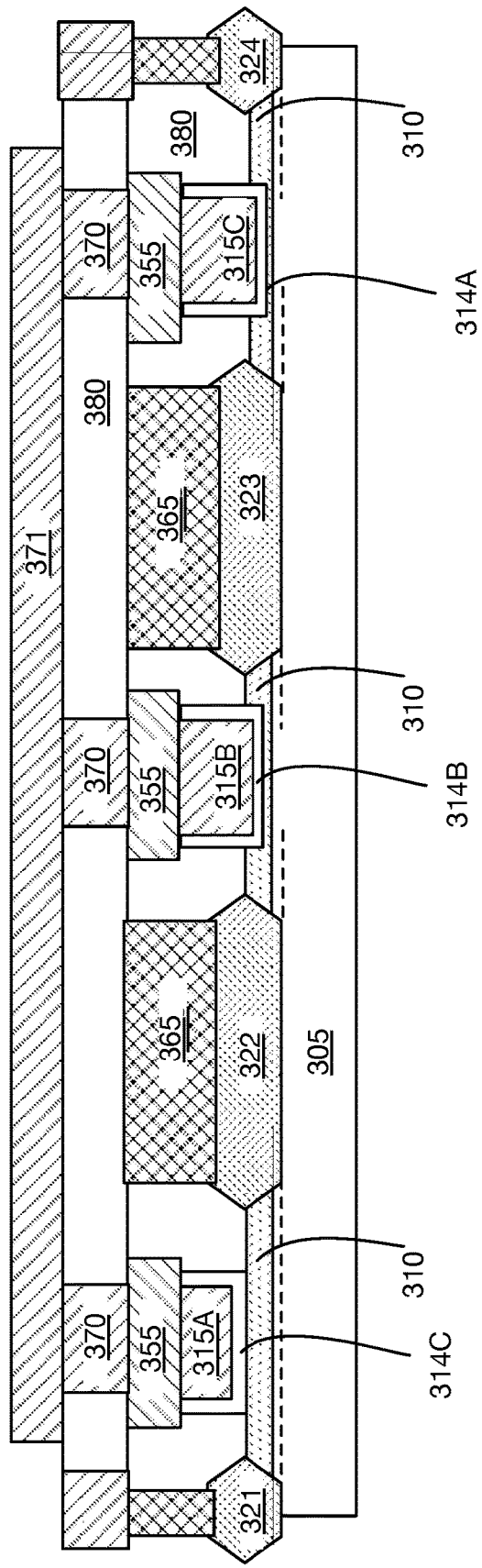

Returning to FIG. 4, methods 401 continue at operation 408 where gate terminals are interconnected into electrical parallel and semiconductor terminals are coupled into electrical parallel. Any suitable backend of line (BEOL) process(es) may be utilized to so interconnect the MOS capacitor terminals. In the example further illustrated in FIG. 5I-5L, damascene processing techniques are employed to form T-gate structures, conductive vias and conductive lines. In reference to FIG. 5I, dielectric material 380 is deposited over gate electrodes 315A-315C and over semiconductor terminals 321-324. Dielectric material 380 is then patterned to expose gate electrodes 315A-315C within openings that are backfilled with T-gate contacts 355, as further shown in FIG. 5J. With the gate terminals complete, dielectric material 380 may be patterned to expose semiconductor terminals 321-324 within openings that are backfilled with semiconductor terminal contact metallization 365, as illustrated in FIG. 5K. In some embodiments, these operations may be combined. In reference to FIG. 5L, interconnection of the gate terminals is completed with patterning of interconnect metallization 371 to arrive at the structure substantially as introduced above in the context of FIG. 3.

Methods 401 (FIG. 4) are then complete and any other known processing may be performed to compete an IC incorporating tunable FET capacitor structures. Notably, no particular order is required by methods 401. For example, the operations illustrated in FIG. 3 are numbered consecutively for the sake of discussion, and the associated operations need not be so ordered.

Figure 6:
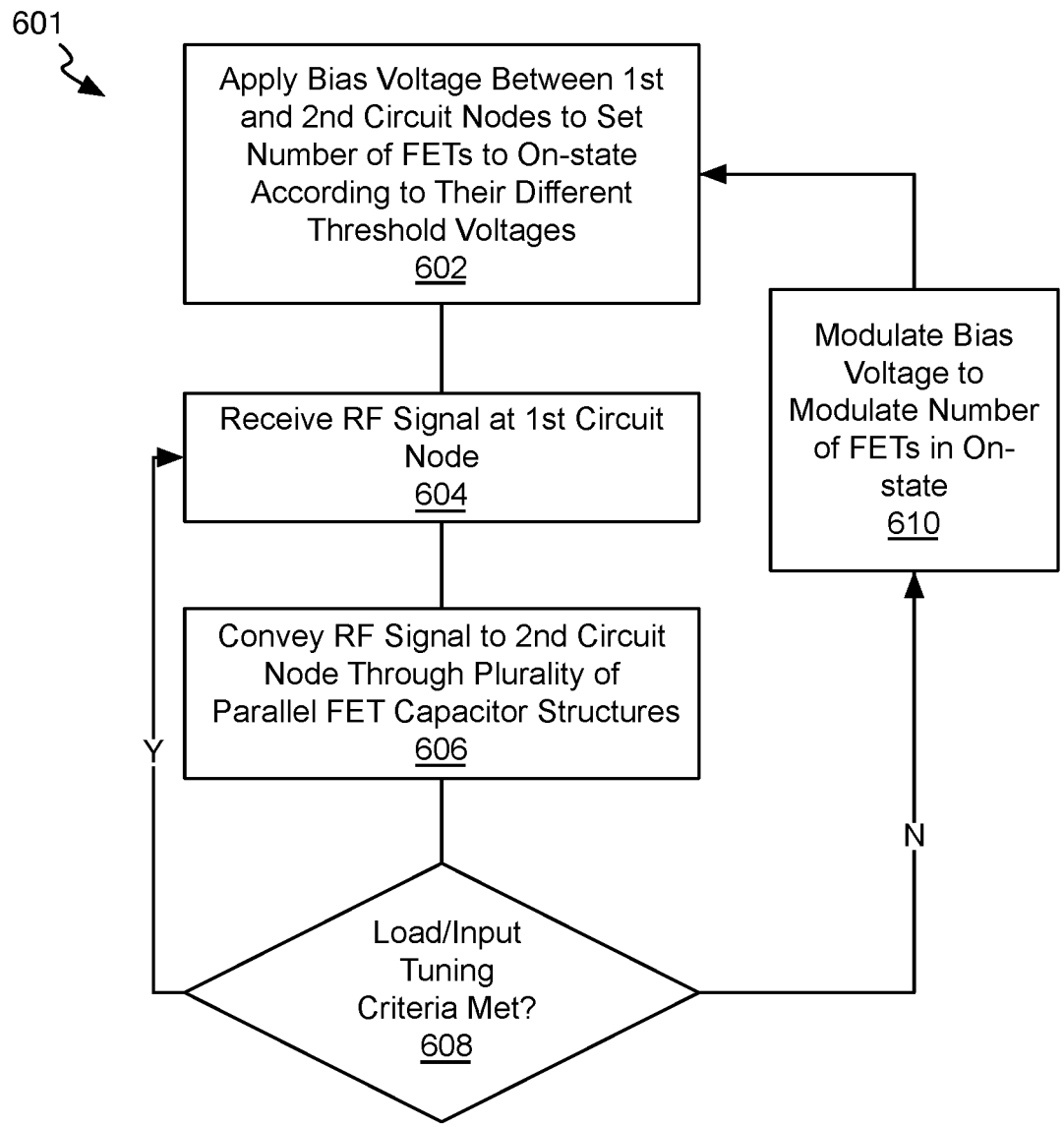
FIG. 6 is a flow diagram illustrating methods of tuning a circuit between a plurality of discrete capacitance levels, in accordance with some embodiments.

The FET capacitor structures and tunable capacitance IC described above may be operated in a device platform, such as a mobile handset, according to a variety of techniques. FIG. 6 is a flow diagram illustrating methods 601 for tuning a circuit between a plurality of discrete capacitance levels, in accordance with some embodiments. Methods 601 may be performed, for example during operation of an RF transmitter and/or receiver. In some embodiments, methods 601 are performed by hardware within a mobile handset. Methods 601 may, for example, be stored on a computer readable medium, and accessed during operation of the RF transmitter and/or receiver.

Methods 601 begin at operation 602 where a tuning bias voltage is applied between a first node of a circuit, and a second node of the circuit that is coupled to the first node through a plurality of FET MOS (MIS) capacitor structures. The tuning bias voltage applied at operation 602 is to set an integer number of FET capacitor structures into an on-state according to their different threshold voltages. At operation 604, an RF signal is further received at the first circuit node. In some embodiments, the RF signal is received from a power amplifier. In exemplary embodiments the RF signal exceeds 1 GHz (e.g., 1.6 GHz, 2-2.4 GHz, 3.5 GHz). At operation 606, the RF signal is conveyed to the second circuit node through the plurality of FET capacitor structures. A operation 608, a load and input tuning criteria is compared to a response (e.g., reflected power, etc.) that is indicative of how well the RF signal received at the first node is matched to a reactive load further coupled to the second circuit node. Where the tuning criteria are met, methods 601 continue back to operation 604 where RF signals continue to be conveyed. Where the tuning criteria are not met, methods 601 continue to operation 610 where the tuning bias voltage is modulated (e.g., increasing or decreasing the voltage from an initial value) to vary the number of FET capacitor structures in the on-state. Methods 601 then continue to iterate, for example while an active RF matching network control algorithm executes operations 608 and 610 to update the tuning bias voltage as a function of the load and input tuning criteria, and matching response.

Figure 7:
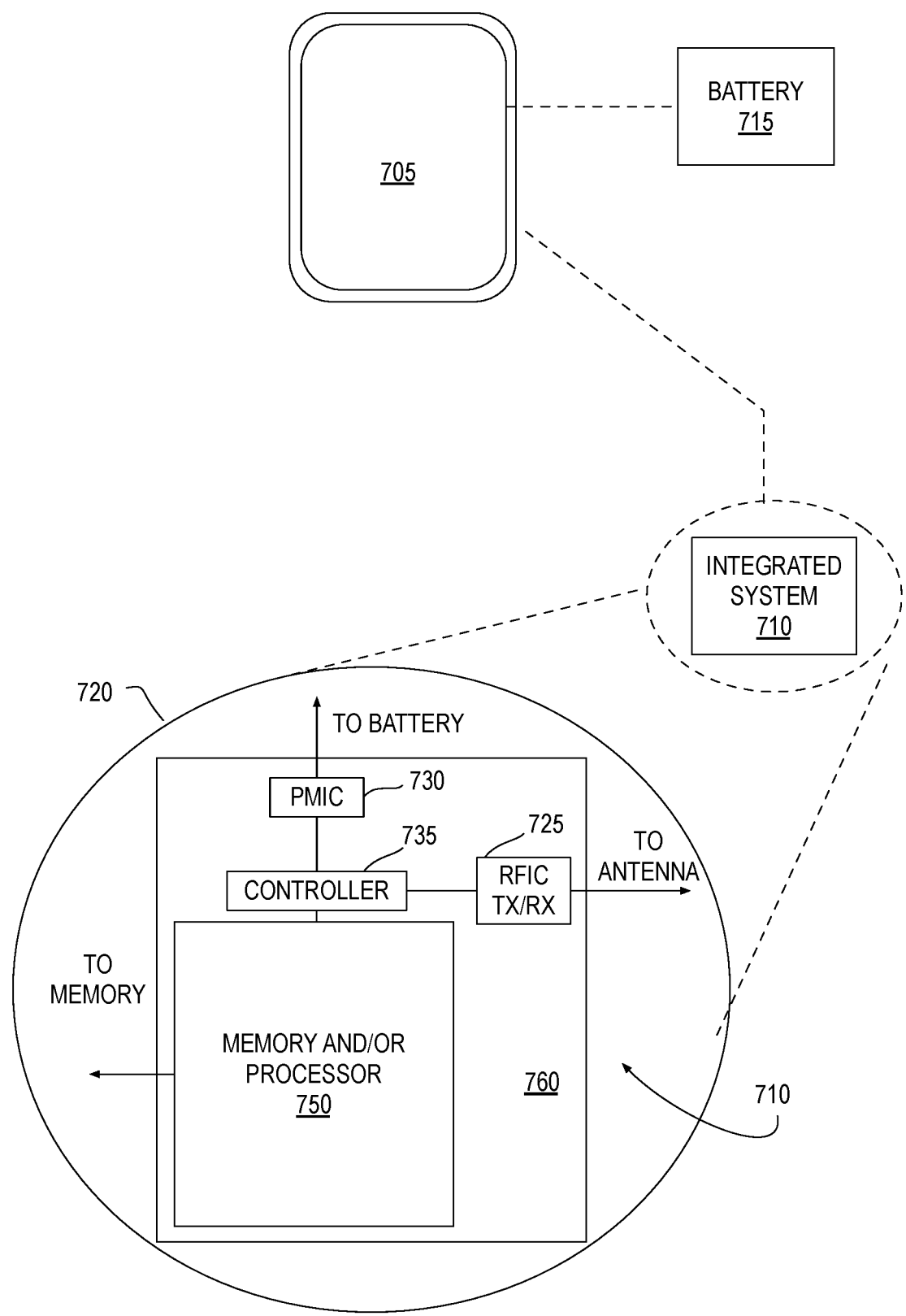
FIG. 7 illustrates a mobile computing platform employing an SoC including circuitry with tunable capacitance, in accordance with embodiments.

FIG. 7 illustrates a mobile computing platform 705 that employs an RFIC including a tunable input/load matching network with III-N FET capacitor structures associated with different threshold voltages, for example as described elsewhere herein. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Whether disposed within the integrated system 710 illustrated in the expanded view 720, or as a stand-alone packaged chip, IC 750 may include memory (e.g., RAM), and/or a processor chip (e.g., a microprocessor, a multi-core microprocessor, graphics processor, or the like) including a tunable input/load matching network with III-N FET capacitor structures associated with different threshold voltages, for example as described elsewhere herein. IC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller thereof 735. One or more of PMIC 730 and RFIC 725 may in addition, or in the alternative, include a tunable input/load matching network with III-N FET capacitor structures associated with different threshold voltages, for example as described elsewhere herein.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the IC 750 or within a single IC coupled to the package substrate of the IC 750.

Figure 8:
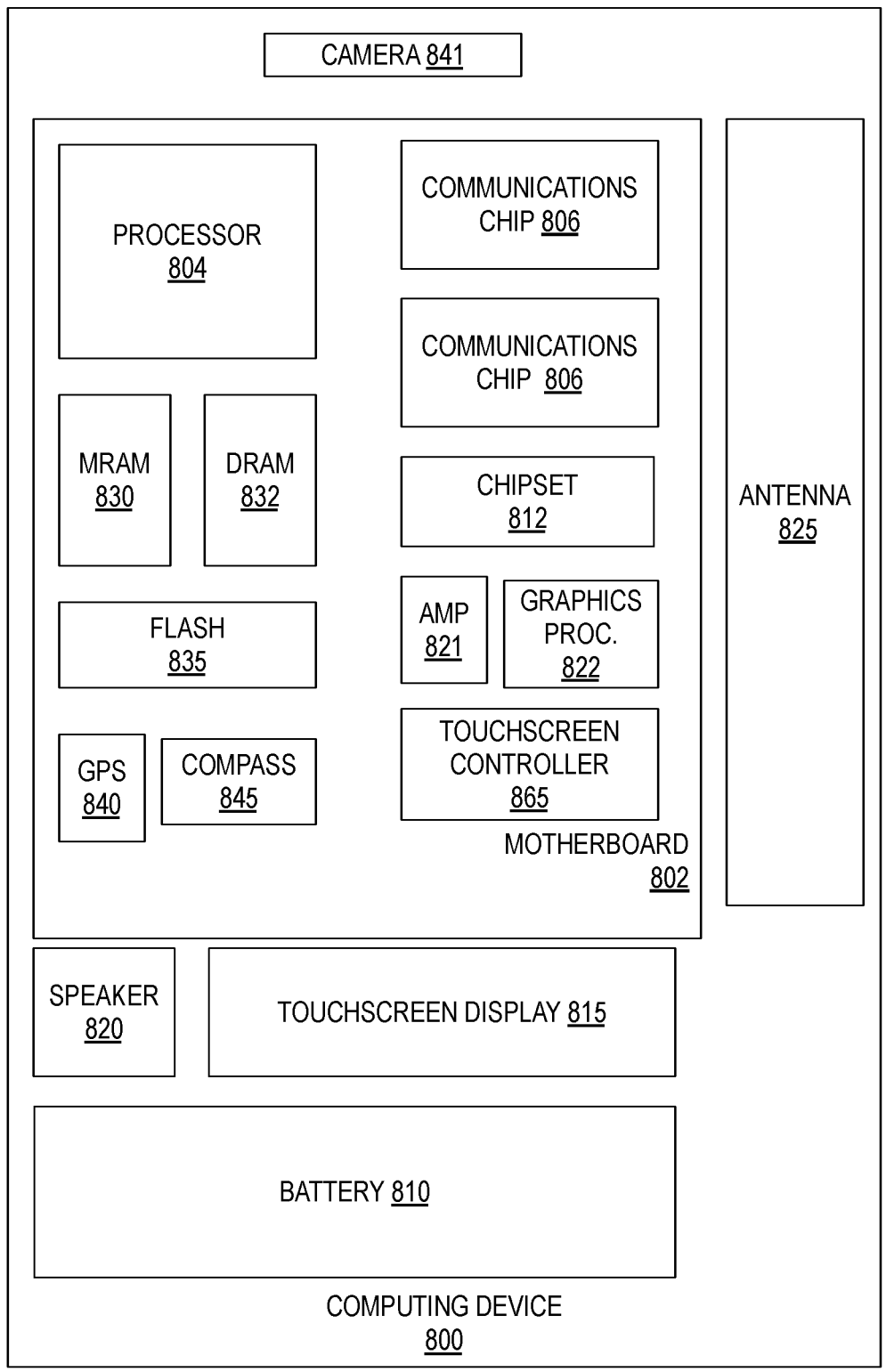
FIG. 8 is a functional block diagram of an electronic computing device, in accordance with some embodiments.

FIG. 8 is a functional block diagram of a computing device 800, arranged in accordance with at least some implementations of the present disclosure. Computing device 800 may be found inside platform 705, for example. Device 800 further includes a motherboard 802 hosting a number of components, such as, but not limited to, a processor 804 (e.g., an applications processor), which may further incorporate a tunable input/load matching network with III-N FET capacitor structures that have different threshold voltages, for example as described elsewhere herein. Processor 804 may be physically and/or electrically coupled to motherboard 802. In some examples, processor 804 includes an integrated circuit die packaged within the processor 804. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM 832), non-volatile memory (e.g., MRAM 830), flash memory 835, a graphics processor 822, a digital signal processor, a crypto processor, a chipset 812, an antenna 825, touchscreen display 815, touchscreen controller 865, battery 810, audio codec, video codec, power amplifier 821, global positioning system (GPS) device 840, compass 845, accelerometer, gyroscope, speaker 820, camera 841, and mass storage device (such as hard disk drive, solid-state drive (SSD), compact disk (CD), digital versatile disk (DVD), or the like).

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others. One or more of communication chips 806 may include a tunable input/load matching network with III-N FET capacitor structures that have different threshold voltages, for example as described elsewhere herein.

Figure 9:
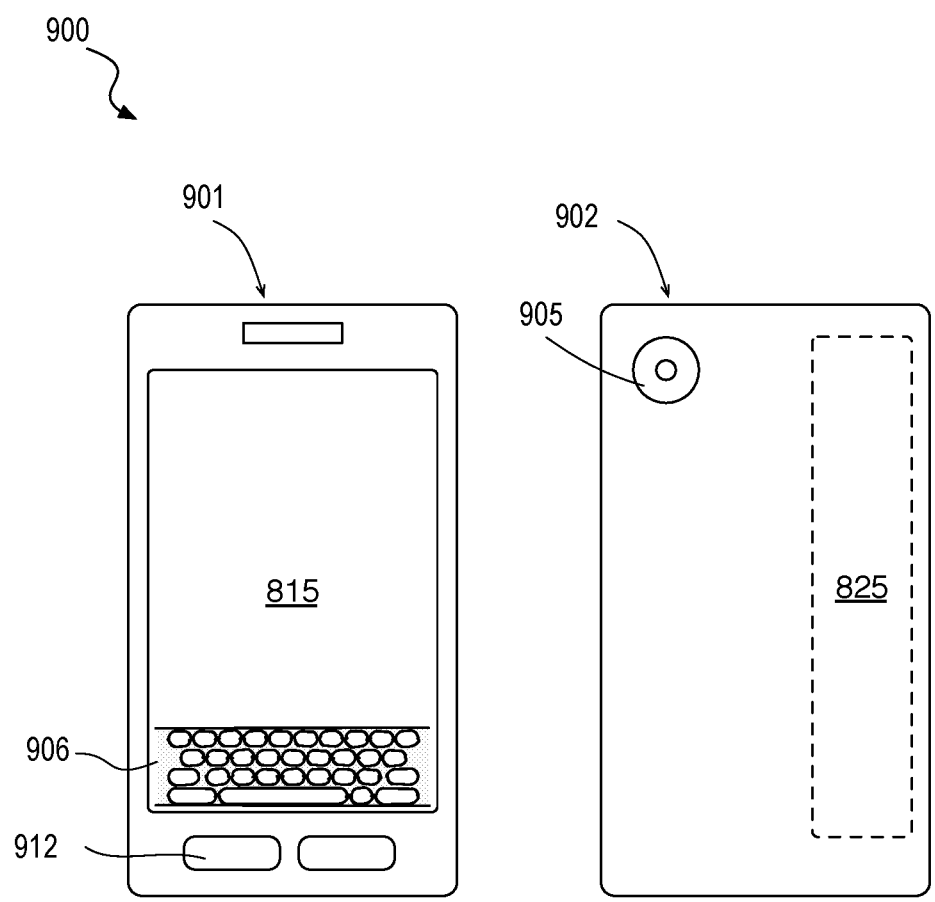
FIG. 9 is a diagram of an exemplary mobile handset platform including a FET capacitor IC having a tunable capacitance, in accordance with some embodiments

As described above, device 800 may be embodied in varying physical styles or form factors. FIG. 9 illustrates embodiments of a mobile handset device 900 in which device 800 may be embodied. In embodiments, for example, device 900 may be implemented as a mobile computing device having wireless capabilities. A mobile computing device may refer to any device having a processing system and a mobile power source or supply, such as one or more batteries, for example. Examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smartphone, tablet or smart television), mobile internet device (MID), messaging device, data communication device, and so forth. Examples of a mobile computing device also may include computers and/or media capture/transmission devices configured to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 9, mobile handset device 900 may include a housing with a front 901 and back 902. Device 900 includes display 815, an input/output (I/O) device 906, and integrated antenna 825. Device 900 also may include navigation features 912. Display 815 may include any suitable display unit for displaying information appropriate for a mobile computing device. I/O device 906 may include any suitable I/O device for entering information into a mobile computing device. Examples for I/O device 906 may include an alphanumeric keyboard, a numeric keypad, a touch pad, input keys, buttons, switches, microphones, speakers, voice recognition device and software, and so forth. Information also may be entered into device 900 by way of microphone (not shown), or may be digitized by a voice recognition device. Embodiments are not limited in this context. Integrated into at least the back 902 is camera 905 (e.g., including one or more lenses, apertures, and image sensors).

Embodiments described herein may be implemented using hardware elements, software elements, or a combination of both. Examples of hardware elements or modules include: processors, microprocessors, circuitry, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software elements or modules include: applications, computer programs, application programs, system programs, machine programs, operating system software, middleware, firmware, routines, subroutines, functions, methods, procedures, software interfaces, application programming interfaces (API), instruction sets, computing code, computer code, code segments, computer code segments, data words, values, symbols, or any combination thereof. Determining whether an embodiment is implemented using hardware elements and/or software elements may vary in accordance with any number of factors considered for the choice of design, such as, but not limited to: desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable storage medium. Such instructions may reside, completely or at least partially, within a main memory and/or within a processor during execution thereof by the machine, the main memory and the processor portions storing the instructions then also constituting a machine-readable storage media. Programmable logic circuitry may have registers, state machines, etc. configured by the processor implementing the computer readable media. Such logic circuitry, as programmed, may then be understood to have been physically transformed into a system falling within the scope of the embodiments described herein. Instructions representing various logic within the processor, which when read by a machine may also cause the machine to fabricate logic adhering to the architectures described herein and/or to perform the techniques described herein. Such representations, known as cell designs, or IP cores, may be stored on a tangible, machine-readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments other than those described in detail above may be practiced with modification and alteration without departing from the scope of the appended claims. For example the above embodiments may include specific combinations of features as further provided below:

In first examples, a radio frequency (RF) transmitter comprises an antenna, a power amplifier, and an RF matching circuit coupled between the power amplifier and the antenna. The RF matching circuit has a tunable capacitance, and wherein the RF matching circuit comprises a plurality of field effect transistor (FET) capacitor structures. Individual ones of the FET capacitor structures comprise a source, a drain, and a gate electrode. The gate electrode of individual ones of the FET capacitor structures are coupled in electrical parallel to a first circuit node to convey a radio frequency (RF) signal. Both the source and the drain of individual ones of the FET capacitor structures are coupled to a second circuit node to convey the RF signal. A gate-source threshold voltage of the FET capacitor structures varies across the plurality, and a number of the FET capacitor structures in an on-state is to vary the tunable capacitance as a function of a bias voltage between the first and second circuit nodes relative to a threshold voltage of individual ones of the FET capacitor structures.

In second examples, for any of the first examples the tunable capacitance comprises a MOS capacitance of the plurality of FET capacitor structures, and wherein the gate-source threshold voltage varies by less than 10 volts.

In third examples, for any of the second examples the gate-source threshold voltage varies over a range of at least 4 volts that includes 0 volts, and wherein at least one of the FET structures is operable in an enhancement mode.

In fourth examples, for any of first through third examples at least some of the FET capacitor structures are operable in a depletion mode and the gate-source threshold voltage varies over a range that includes −3 volts.

In fifth examples for any of the first through fourth examples a maximum MOS capacitance of individual ones of the FET capacitor structures varies over the plurality.

In sixth examples, for any of the first through fifth examples the source and drain are coupled through a group III-nitride (III-N) material.

In seventh examples, for any of the sixth examples at least some of the FET capacitor structures further comprise a gate dielectric material between the gate electrode an the III-N material.

In eighth examples, for any of the sixth through seventh examples a first of the FET capacitor structures comprises a first recessed gate electrode separated from the III-N material by a first distance and a second of the FET capacitor structures comprises a second recessed gate electrode separated from the III-N material by a second distance, different than the first distance.

In ninth examples, for any of the sixth through eighth examples the III-N material is a first III-N material comprising Ga and N, and a second III-N material is between the first and second gate dielectrics and the first III-N material. The second III-N material comprises more Al than the first III-N material. A c-plane of the first and second III-N materials is no more than 10° from parallel to plane of an underlying substrate.

In tenth examples, for any of the sixth through ninth examples the source and the drain of the FET capacitor structures further comprises a third III-N material and wherein a source of a first of the FET capacitor structures is in directed contact with a drain of a second of the FET capacitor structures.

In eleventh examples, for any of the first through tenth examples the transmitter further comprises an RF receiver coupled to the RF matching network, and a battery coupled to the RF transmitter and the RF receiver.

In twelfth examples, an integrated circuit (IC) with tunable capacitance comprises a first circuit node to convey a radio frequency (RF) signal, the first circuit node coupled in electrical parallel to gate electrodes of a plurality of Group III-nitride (III-N) field effect transistor (FET) capacitor structures. The III-N FET capacitor structures further comprise a source and drain coupled through a III-N material, and a gate electrode between the source and the drain. The IC comprises a second circuit node to convey the RF signal, the second circuit node coupled to both a source and a drain of at least some of the III-N FET capacitor structures. A threshold voltage of the III-N FET capacitor structures varies across the plurality, and the tunable capacitance is to vary with a number of the III-N FET capacitor structures that are in an on-state as a function of a bias voltage between the input and output nodes relative to the threshold voltage of individual ones of the III-N FET capacitor structures.

In thirteenth examples, for any of the twelfth examples the tunable capacitance comprises a MOS capacitance of the plurality of III-N FET capacitor structures, the gate-source threshold voltage varies over a range less than 10V. At least some of the III-N FET capacitor structures are operable in a depletion mode.

In fourteenth examples, for any of the twelfth through thirteenth examples a first of the FET capacitor structures comprises a first recessed gate electrode separated from the III-N material by a first distance, and a second of the FET capacitor structures comprises a second recessed gate electrode separated from the III-N material by a second distance, different than the first distance.

In fifteenth examples, a method of forming an integrated circuit (IC) comprises receiving a workpiece comprising a first III-N material under a second III-N material. The method comprises forming a first FET capacitor structure within a first region of the workpiece, wherein the first FET capacitor structure has a first source-gate threshold voltage. The method comprises forming a second FET capacitor structure within a second region of the workpiece, wherein the second FET capacitor structure has a second source-gate threshold voltage, different than the first source-gate threshold voltage. The method comprises coupling both a source and a drain of the first FET capacitor structure in electrical parallel with a source and a drain of the second FET capacitor structure. The method comprises coupling a gate electrode of the first FET capacitor structure in electrical parallel with a gate electrode of the second FET capacitor structure.

In sixteenth examples, for any of the fifteenth examples, forming the first FET capacitor structure and the second FET capacitor structure further comprises forming the first source and the first drain coupled through a first channel region comprising the first III-N material, forming the second source and the second drain coupled through a second channel region the first III-N material, forming a first recess that exposes a first thickness of III-N material within the first channel region, forming a second recess that exposes a second thickness of III-N material within the second channel region, forming a first gate stack within the first recess, the first gate stack comprising the gate electrode separated from the first channel region by a gate dielectric, forming a second gate stack within the second recess, the second gate stack comprising a gate electrode separated from the second channel region by a gate dielectric, and forming an interconnect contacting both the first gate electrode and the second gate electrode.

In seventeenth examples, for any of the fifteenth through sixteenth examples forming the first recess further comprises forming a first mask with a first opening over a first portion of the second III-N material, and etching partially through the second III-N material within the first opening. Forming the second recess further comprises forming a second mask with a second opening over a second portion of the second III-N material, and etching partially through the second III-N material within the second opening.

In eighteenth examples, for any of the seventeenth examples forming the first gate stack further comprises depositing the gate dielectric material within the first recess and depositing the first gate electrode over the gate dielectric material, and forming the second gate stack further comprises depositing the gate dielectric material within the second recess and depositing the second gate electrode over the gate dielectric material.

In nineteenth examples, for any of the eighteenth examples coupling the source and a drain of the first FET capacitor structure in electrical parallel with the source and a drain of the second FET capacitor structure further comprises forming a third III-N material coupled to both the first channel region and the second channel region.

In twentieth examples, a method of tuning a capacitance of a radio frequency (RF) integrated circuit comprises applying an RF signal to a first circuit node, wherein the first circuit node is coupled to a second circuit node through a plurality of field effect transistor (FET) capacitor structures. Individual ones of the FET capacitor structures comprise a source, a drain, and a gate electrode between the source and the drain, the gate electrode of individual ones of the FET capacitor structures are coupled in electrical parallel to the first circuit node. Both the source and the drain of individual ones of the FET capacitor structures are coupled in electrical parallel to the second circuit node. The method further comprises varying a number of the FET capacitor structures in an on-state by varying a bias voltage between the first circuit node and the second circuit node.

In twenty-first examples, for any of the twentieth examples varying the bias voltage further comprises varying the bias voltage by less than 10V over a range that include 0V.

In twenty-second examples for any of the twentieth through twenty-first examples the FET capacitor structures comprise a Group III-nitride (III-N) material.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. A radio frequency (RF) transmitter, comprising:
an antenna;
a power amplifier; and
an RF matching circuit coupled between the power amplifier and the antenna, wherein the RF matching circuit has a tunable capacitance, and wherein the RF matching circuit comprises:
a plurality of field effect transistor (FET) capacitor structures, wherein:
individual ones of the FET capacitor structures comprise a source, a drain, and a gate electrode, wherein the source and drain of individual ones of the FET capacitor structures are coupled through a Group III-nitride (III-N) material;
the gate electrode of individual ones of the FET capacitor structures are coupled in electrical parallel to a first circuit node to convey a radio frequency (RF) signal wherein a first of the FET capacitor structures comprises a first gate electrode separated from the III-N material by a first distance and a second of the FET capacitor structures comprises a second gate electrode separated from the III-N material by a second distance, different than the first distance, and wherein at least one of the source and the drain of individual ones of the FET capacitor structures are coupled to a second circuit node to convey the RF signal;
a gate-source threshold voltage of the FET capacitor structures varies across the plurality; and
a number of the FET capacitor structures in an on-state is to vary a tunable capacitance as a function of a bias voltage between the first and second circuit nodes relative to a threshold voltage of individual ones of the FET capacitor structures.

2. The RF transmitter of claim 1, wherein the tunable capacitance comprises a MOS capacitance of the plurality of FET capacitor structures, and wherein the gate-source threshold voltage varies by less than 10 volts.

3. The RF transmitter of claim 2, wherein the gate-source threshold voltage varies over a range of at least 4 volts that includes 0 volts, and wherein at least one of the FET structures is operable in an enhancement mode.

4. The RF transmitter of claim 3, wherein at least some of the FET capacitor structures are operable in a depletion mode and the gate-source threshold voltage varies over a range that includes −3 volts.

5. The RF transmitter of claim 4, wherein a maximum MOS capacitance of individual ones of the FET capacitor structures varies over the plurality.

6. The RF transmitter of claim 1, wherein at least some of the FET capacitor structures further comprise a gate dielectric material between the gate electrode an the III-N material.

7. The RF transmitter of claim 1, wherein:
the III-N material is a first III-N material comprising Ga and N;
a second III-N material is between a gate dielectric material and the first III-N material;
the second III-N material comprises more Al than the first III-N material; and
a c-plane of the first and second III-N materials is no more than 10° from parallel to plane of an underlying substrate.

8. The RF transmitter of claim 7, wherein the source and the drain of the FET capacitor structures further comprises a third III-N material and wherein a source of the first of the FET capacitor structures is in direct contact with a drain of the second of the FET capacitor structures.

9. The RF transmitter of claim 1, further comprising a battery coupled to the RF transmitter.

10. An integrated circuit (IC) with tunable capacitance, comprising:
a first circuit node to convey a radio frequency (RF) signal, the first circuit node coupled in electrical parallel to gate electrodes of a plurality of Group III-nitride (III-N) field effect transistor (FET) capacitor structures, wherein individual ones of the III-N FET capacitor structures further comprise:
a source and drain coupled through a III-N material; and
a gate electrode between the source and the drain, wherein a first of the FET capacitor structures comprises a first gate electrode separated from the III-N material by a first distance and a second of the FET capacitor structures comprises a second gate electrode separated from the III-N material by a second distance, different than the first distance;
a second circuit node to convey the RF signal, the second circuit node coupled to at least one of a source and a drain of individual ones of the III-N FET capacitor structures, wherein:
a threshold voltage of the III-N FET capacitor structures varies across the plurality; and
the tunable capacitance is to vary with a number of the III-N FET capacitor structures that are in an on-state as a function of a bias voltage between the first and second circuit nodes relative to the threshold voltage of individual ones of the III-N FET capacitor structures.

11. The IC of claim 10, wherein:
the tunable capacitance comprises a MOS capacitance of the plurality of III-N FET capacitor structures;
the threshold voltage varies over a range less than 10V; and
at least some of the III-N FET capacitor structures are operable in a depletion mode.

12. A method of tuning a capacitance of a radio frequency (RF) integrated circuit, the method comprising:
applying the RF signal to the first circuit node of claim 10; and
varying a number of the FET capacitor structures in an on-state by varying the bias voltage between the first circuit node and the second circuit node.

13. A method of forming an integrated circuit (IC), the method comprising:
receiving a workpiece comprising a first III-N material under a second III-N material;
forming a first FET capacitor structure within a first region of the workpiece, wherein the first FET capacitor structure has a first source-gate threshold voltage;
forming a second FET capacitor structure within a second region of the workpiece, wherein the second FET capacitor structure has a second source-gate threshold voltage, different than the first source-gate threshold voltage;
coupling both a source and a drain of the first FET capacitor structure in electrical parallel with a source and a drain of the second FET capacitor structure; and
coupling a gate electrode of the first FET capacitor structure in electrical parallel with a gate electrode of the second FET capacitor structure.

14. The method of claim 13, wherein forming the first FET capacitor structure and the second FET capacitor structure further comprises:
forming the first source and the first drain coupled through a first channel region comprising the first III-N material;
forming the second source and the second drain coupled through a second channel region the first III-N material;
forming a first recess that exposes a first thickness of III-N material within the first channel region;
forming a second recess that exposes a second thickness of III-N material within the second channel region;
forming a first gate stack within the first recess, the first gate stack comprising the gate electrode separated from the first channel region by a gate dielectric;
forming a second gate stack within the second recess, the second gate stack comprising a gate electrode separated from the second channel region by a gate dielectric; and
forming an interconnect contacting both the first gate electrode and the second gate electrode.

15. The method of claim 14, wherein:
forming the first recess further comprises:
forming a first mask with a first opening over a first portion of the second III-N material; and
etching partially through the second III-N material within the first opening;
forming the second recess further comprises:
forming a second mask with a second opening over a second portion of the second III-N material; and
etching partially through the second III-N material within the second opening.

16. The method of claim 15, wherein:
forming the first gate stack further comprises depositing the gate dielectric material within the first recess and depositing the first gate electrode over the gate dielectric material; and
forming the second gate stack further comprises depositing the gate dielectric material within the second recess and depositing the second gate electrode over the gate dielectric material.

17. The method of claim 16, wherein coupling the source and the drain of the first FET capacitor structure in electrical parallel with the source and the drain of the second FET capacitor structure further comprises forming a third III-N material coupled to both the first channel region and the second channel region.

* * * * *